(12) United States Patent
Cho

(10) Patent No.: US 10,326,081 B2
(45) Date of Patent: Jun. 18, 2019

(54) ORGANIC LIGHT-EMITTING DEVICE HAVING IMPROVED EFFICIENCY CHARACTERISTICS AND ORGANIC LIGHT-EMITTING DISPLAY APPARATUS INCLUDING THE SAME

(71) Applicant: SAMSUNG DISPLAY CO., LTD., Yongin, Gyeonggi-Do (KR)

(72) Inventor: Hwan-Hee Cho, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 974 days.

(21) Appl. No.: 13/940,169

(22) Filed: Jul. 11, 2013

(65) Prior Publication Data

US 2014/0191206 A1 Jul. 10, 2014

(30) Foreign Application Priority Data

Jan. 4, 2013 (KR) .................. 10-2013-0001210

(51) Int. Cl.
*H01L 51/00* (2006.01)
*C09K 11/06* (2006.01)
*H01L 51/50* (2006.01)

(52) U.S. Cl.
CPC .......... *H01L 51/0072* (2013.01); *C09K 11/06* (2013.01); *H01L 51/0052* (2013.01); *H01L 51/0058* (2013.01); *H01L 51/50* (2013.01); *H01L 51/5004* (2013.01); *H01L 51/5016* (2013.01); *C09K 2211/185* (2013.01); *H01L 51/0061* (2013.01); *H01L 51/0085* (2013.01); *H01L 51/0087* (2013.01);

(Continued)

(58) Field of Classification Search
CPC ................. H01L 51/0072; H01L 51/5004
See application file for complete search history.

(56) References Cited

U.S. PATENT DOCUMENTS

| 8,263,237 B2 | 9/2012 | Kim et al. |
| 2003/0168970 A1* | 9/2003 | Tominaga ............... C07C 15/28 313/504 |

(Continued)

FOREIGN PATENT DOCUMENTS

| KR | 10-2009-0072989 A | 7/2009 |
| KR | 10-2010-0064587 A | 6/2010 |
| KR | 10-2010-0047588 | 10/2010 |

(Continued)

OTHER PUBLICATIONS

Korean Office Action dated Dec. 11, 2018 issued by the KIPO for corresponding Korean Patent Application No. 10-2013-0001210, 9 pages.

*Primary Examiner* — Robert A Vetere
(74) *Attorney, Agent, or Firm* — Lewis Roca Rothgerber Christie LLP

(57) ABSTRACT

An organic light-emitting device includes: a first electrode, a second electrode facing the first electrode, a phosphorescent emission layer between the first electrode and the second electrode, an electron transportation layer between the phosphorescent emission layer and the second electrode, an electron control layer between the phosphorescent emission layer and the electron transportation layer, and an electron blocking layer between the phosphorescent emission layer and the first electrode. An organic light-emitting display apparatus includes the organic light-emitting device.

20 Claims, 8 Drawing Sheets

(52) U.S. Cl.
CPC ...... *H01L 51/5072* (2013.01); *H01L 51/5096* (2013.01); *H01L 2251/558* (2013.01)

(56) References Cited

U.S. PATENT DOCUMENTS

| | | | | |
|---|---|---|---|---|
| 2003/0197467 | A1* | 10/2003 | Adachi | H01L 51/5088 |
| | | | | 313/504 |
| 2005/0123797 | A1* | 6/2005 | Kondakova | H01L 51/0059 |
| | | | | 428/690 |
| 2005/0186446 | A1* | 8/2005 | Shitagaki | C07D 241/42 |
| | | | | 428/690 |
| 2005/0280616 | A1* | 12/2005 | Miwa | G09G 3/3233 |
| | | | | 345/77 |
| 2006/0093857 | A1* | 5/2006 | Nakashima | C07C 15/24 |
| | | | | 428/690 |
| 2007/0247067 | A1* | 10/2007 | Segal | H01L 51/5012 |
| | | | | 313/506 |
| 2007/0252516 | A1* | 11/2007 | Kondakova | H01L 51/5016 |
| | | | | 313/504 |
| 2009/0167168 | A1* | 7/2009 | Seo | H01L 51/5004 |
| | | | | 313/504 |
| 2010/0308315 | A1* | 12/2010 | Arakane | C09K 11/06 |
| | | | | 257/40 |
| 2011/0084259 | A1* | 4/2011 | Lee | H01L 51/5048 |
| | | | | 257/40 |
| 2012/0097924 | A1 | 4/2012 | Kim et al. | |

FOREIGN PATENT DOCUMENTS

| | | |
|---|---|---|
| KR | 10-2011-0040735 A | 4/2011 |
| KR | 10-2011-0099165 A | 9/2011 |
| KR | 10-2012-0043623 | 5/2012 |

* cited by examiner

ORGANIC LIGHT-EMITTING DEVICE HAVING IMPROVED EFFICIENCY CHARACTERISTICS AND ORGANIC LIGHT-EMITTING DISPLAY APPARATUS INCLUDING THE SAME

CROSS-REFERENCE TO RELATED PATENT APPLICATION

This application claims priority to and the benefit of Korean Patent Application No. 10-2013-0001210, filed on Jan. 4, 2013 in the Korean Intellectual Property Office, the entire content of which is incorporated herein by reference.

BACKGROUND

1. Technical Field

Embodiments of the present invention relate to an organic light-emitting device with improved efficiency characteristics, and in particular, to an organic light-emitting device with improved luminescent efficiency characteristics with respect to brightness, and an organic light-emitting display apparatus with improved luminescent efficiency characteristics in a black state due to the inclusion of the organic light-emitting device.

2. Description of the Related Art

Organic light-emitting devices (OLEDs) are self-emitting devices having advantages such as wide viewing angles, good contrast, quick response speeds, high brightness, and good driving voltage characteristics. Also, OLEDs can provide multicolored images. Due to such advantages, OLEDs are getting much attention.

A typical OLED has a structure including a substrate, and an anode, a hole transport layer (HTL), an emission layer (EML), an electron transport layer (ETL), and a cathode sequentially stacked on the substrate. In this regard, the HTL, the EML, and the ETL are, in general, formed of organic compounds. When a voltage is applied between the anode and the cathode, holes injected from the anode move to the EML via the HTL, and electrons injected from the cathode move to the EML via the ETL. Carriers (holes and electrons) are recombined in the EML to generate excitons, and the excitons drop from an excited state to a ground state, thereby emitting light.

A major factor affecting the luminescent efficiency of an organic light-emitting device is the luminescent material. As the luminescent material, fluorescent materials have been used, but use of phosphorescent materials (which may improve luminescent efficiency up to 4 times as high as fluorescent materials) is gradually increasing.

In low brightness regions, organic light-emitting devices using phosphorescent materials have high efficiency compared to organic light-emitting devices using fluorescent materials. In particular, since an organic light-emitting device using a phosphorescent material has high luminescent efficiency even in a low current region, even when the organic light-emitting display apparatus needs to show a black state, light is emitted due to a leakage current, and green light or red light is weakly emitted. To improve this leakage, a layer for delaying transportation of holes can be introduced between the HTL and the EML, or pure metal can be applied to the EIL.

However, even when these methods are used, the low brightness efficiency characteristics of the organic light-emitting device using a phosphorescent material are unsatisfactory.

SUMMARY OF THE INVENTION

According to embodiments of the present invention, an organic light-emitting device includes a phosphorescent material, which has high luminescent efficiency in a high brightness region and low luminescent efficiency in a low brightness region.

In some embodiments of the present invention, an organic light-emitting display apparatus includes the organic light-emitting device. In the display apparatus, red and green emission is suppressed in a black state due to the inclusion of the organic light-emitting device.

According to an aspect of the present invention, an organic light-emitting device includes: a first electrode, a second electrode facing the first electrode, a phosphorescent emission layer between the first electrode and the second electrode, an electron transportation layer between the phosphorescent emission layer and the second electrode, and an electron control layer between the phosphorescent emission layer and the electron transportation layer. The phosphorescent emission layer includes a host material and a dopant material, and the electron control layer includes an electron control material and a phosphorescent dopant. A highest occupied molecular orbital (HOMO) energy level ($EH_H$) of the host material, a lowest unoccupied molecular orbital (LUMO) energy level ($EL_H$) of the host material, a highest occupied molecular orbital energy level ($EH_C$) of the electron control material, and a lowest unoccupied molecular orbital energy level ($EL_C$) of the electron control material satisfy $|EH_H - EH_C|$ 0.3 eV and $|EL_H - EL_C|$ 0.5 eV. A thickness of the electron control layer is in a range of about 10 Å to about 450 Å.

According to another aspect of the present invention, an organic light-emitting device includes a first electrode, a second electrode facing the first electrode, a phosphorescent emission layer between the first electrode and the second electrode, an electron transportation layer between the phosphorescent emission layer and the second electrode, an electron control layer between the phosphorescent emission layer and the electron transportation layer, and an electron blocking layer between the phosphorescent emission layer and the first electrode. The phosphorescent emission layer includes a host material and a dopant material, the electron control layer includes an electron control material and a phosphorescent dopant, and the electron blocking layer includes an electron blocking material. A highest occupied molecular orbital energy level ($EH_H$) of the host material, a lowest unoccupied molecular orbital energy level ($EL_H$) of the host material, a highest occupied molecular orbital energy level ($EH_C$) of the electron control material, a lowest unoccupied molecular orbital energy level ($EL_C$) of the electron control material, and a lowest unoccupied molecular orbital energy level ($EL_B$) of the electron blocking material satisfy $|EH_H - EH_C| \leq 0.3$ eV, $|EL_H - EL_C| \leq 0.5$ eV, and $EL_B > EL_H$. A thickness of the electron control layer is in a range of about 10 Å to about 450 Å.

In some embodiments, a highest occupied molecular orbital energy level ($EH_H$) of the host material, a lowest unoccupied molecular orbital energy level ($EL_H$) of the host material, a highest occupied molecular orbital energy level ($EH_C$) of the electron control material, and a lowest unoccupied molecular orbital energy level ($EL_C$) of the electron control material satisfy $0 \leq EH_H - EH_C \leq 0.3$ eV and $0 \leq EL_H - EL_C \leq 0.5$ eV.

Electron mobility of the electron control material may be equal to or higher than the hole mobility thereof.

The highest occupied molecular orbital energy level ($EH_C$) of the electron control material may be in a range of about −5.2 eV to about −6.1 eV.

The lowest unoccupied molecular orbital energy level ($EL_C$) of the electron control material may be in a range of about −2.5 eV to about −3.2 eV.

A thickness of the electron control layer may be in a range of about 30 Å to about 150 Å.

The phosphorescent emission layer may be a blue phosphorescent emission layer, a red phosphorescent emission layer, or a green phosphorescent emission layer.

A thickness of the electron blocking layer may be in a range of about 10 Å to about 1000 Å.

The electron blocking material may include at least one of a triphenylamine derivative, a carbazole derivative, or a spirodifluorene derivative.

The electron control material may include a compound represented by Formula 1 below:

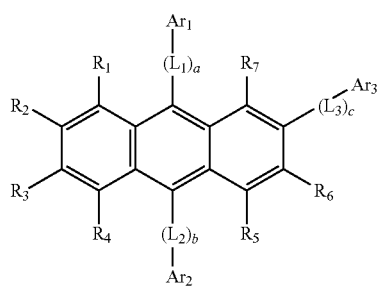

<Formula 1>

In Formula 1, $R_1$ to $R_7$, $Ar_1$, $Ar_2$, and $Ar_3$, $Q_1$ and $Q_2$, $L_1$, $L_2$ and $L_3$, and a, b and c are as described in the detailed description below.

The phosphorescent dopant of the electron control material may be any one of an Ir complex, a Pt complex, a Pd complex, or an Os complex.

The host material may include a bipolar compound including a hole transportation unit and an electron transportation unit.

The host material may include a mixture of a bipolar compound having a hole transportation unit and an electron transportation unit and a compound having at least a hole transportation unit.

The electron control material may include a compound represented by Formula 4 below:

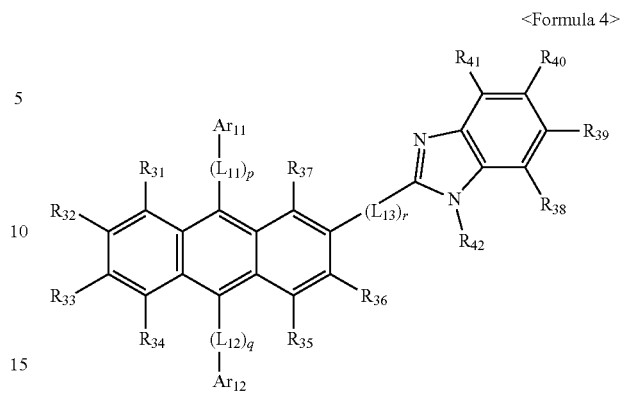

<Formula 4>

In Formula 4, $R_{31}$ to $R_{42}$, $Ar_{11}$ and $Ar_{12}$, $L_{11}$, $L_{12}$, and $L_{13}$, and p, q, and r are as described in the detailed description below.

The electron transportation layer may further include at least one metal complex selected from lithium quinolate (LiQ) and Compound 101 below.

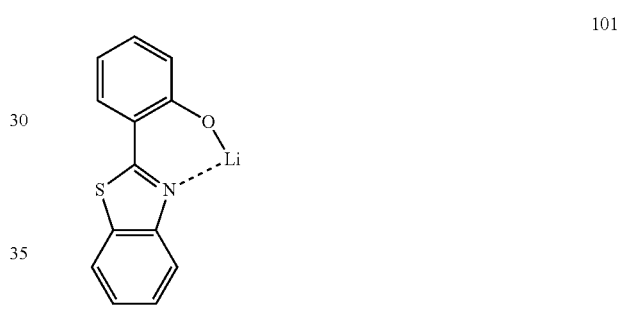

101

According to another aspect of the present invention, an organic light-emitting display apparatus includes the organic light-emitting device as well as a transistor including a source, a drain, a gate, and an active layer. The first electrode of the organic light-emitting device may be electrically connected to the source or the drain.

BRIEF DESCRIPTION OF THE DRAWINGS

The above and other features and advantages of the present invention will become more apparent by reference to the following detailed description when considered in conjunction with the attached drawings in which.

DETAILED DESCRIPTION OF THE INVENTION

Expressions such as "at least one of," when preceding a list of elements, modify the entire list of elements and do not modify the individual elements of the list.

Hereinafter, embodiments of the present invention will be described with reference to the attached drawings.

Figure 1:
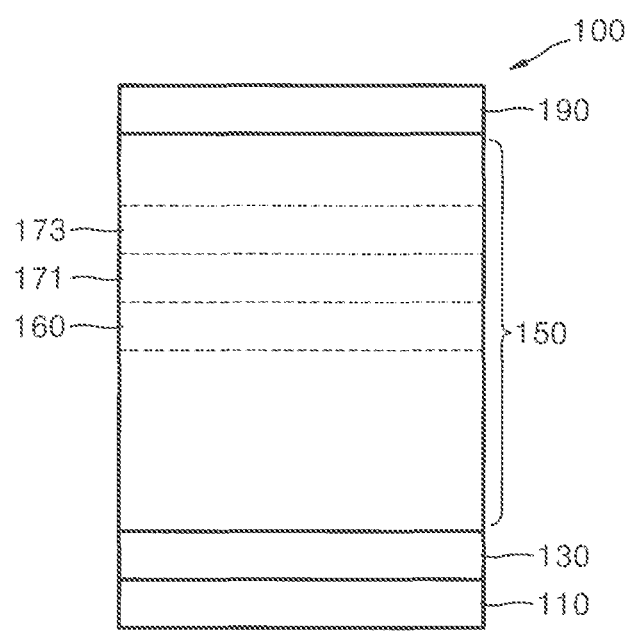
FIG. 1 is a schematic cross-sectional view of an organic light-emitting device according to an embodiment of the present invention.

FIG. 1 is a schematic cross-sectional view of an organic light-emitting device 100 according to an embodiment of the present invention. Referring to FIG. 1, the organic light-emitting device 100 includes a substrate 110, a first electrode 130 formed on the substrate 110, a second electrode 190 facing the first electrode 130, and an organic layer 150 between the first electrode 130 and the second electrode 190.

The organic layer 150 includes an emission layer 160 for emitting light when excitons formed by recombination of holes and electrons drop from an excited state to a ground state. The organic layer 150 also includes an electron transportation layer 173 between the emission layer 160 and the second electrode 190, and an electron control layer 171 between the emission layer 160 and the electron transportation layer 173.

The emission layer 160 is a phosphorescent emission layer including a phosphorescent host material and a dopant material. The electron control layer 173 may include an electron control material and a phosphorescent dopant.

The phosphorescent host and dopant materials embody a light emission mechanism in which light, not heat, is emitted from a triplet excited state. Accordingly, in theory, an organic light-emitting device including an emission layer using a phosphorescent host and a dopant may have a luminescent efficiency that is 4 times as high as that of an organic light-emitting device using a fluorescent material that emits light from a singlet excited state.

A highest occupied molecular orbital energy level ($EH_H$) of the host material, a lowest unoccupied molecular orbital energy level ($EL_H$) of the host material, a highest occupied molecular orbital energy level ($EH_C$) of the electron control material, and a lowest unoccupied molecular orbital energy level ($EL_C$) of the electron control material may satisfy the following two equations:

$$|EH_H - EH_C| \leq 0.3 \text{ eV, and}$$

$$|EL_H - EL_C| \leq 0.5 \text{ eV}$$

The highest occupied molecular orbital energy level ($EH_C$) of the electron control material may be similar to the highest occupied molecular orbital energy level ($EH_H$) of the host material. A difference in the absolute values of the two energy levels is 0.3 eV or less. When the difference between the absolute values of the highest occupied molecular orbital energy level ($EH_C$) of the electron control material and the highest occupied molecular orbital energy level ($EH_H$) of the host material is less than 0.3 eV, the hole blocking mechanism from the emission layer to the electron control layer in a low brightness region may be suppressed.

The difference between the absolute values of the lowest unoccupied molecular orbital energy level ($EL_C$) of the electron control material and the lowest unoccupied molecular orbital energy level ($EL_H$) of the host material may be 0.5 eV or less. When the lowest unoccupied molecular orbital energy level ($EL_C$) of the electron control material and the lowest unoccupied molecular orbital energy level ($EL_H$) of the host material satisfy the relationship described above, satisfactory electron transportation capability may be obtained without an excessive increase in driving voltage.

A thickness of the electron control layer 171 including an electron control material may be in a range of about 10 Å to about 450 Å. The electron control layer 171 may control injection of electrons into the emission layer 160. When the thickness of the electron control layer 171 is 10 Å or more, a decrease in luminescent efficiency in a low brightness region may satisfactorily occur, and when the thickness of the electron control layer 171 is 450 Å or lower, an excessive increase in driving voltage may be suppressed.

Since the organic light-emitting device 100 having such a structure includes the phosphorescent emission layer 160, luminescent efficiency thereof may be substantially improved, and in the high brightness region, holes and electrons are smoothly injected or transported, thereby increasing luminescent efficiency. However, due to the electron control layer 171 of the organic light-emitting device 100, the hole blocking mechanism is suppressed in the low brightness region, and injection and transportation of electrons in the direction from the electron transportation layer 173 to the emission layer 160 may be delayed. Accordingly, in the low brightness region, the balance between electrons and holes for forming excitons in the emission layer 160 may break, thereby decreasing the luminescent efficiency of the organic light-emitting device 100.

The highest occupied molecular orbital energy level ($EH_H$) of the host material, the lowest unoccupied molecular orbital energy level ($EL_H$) of the host material, the highest occupied molecular orbital energy level ($EH_C$) of the electron control material, and the lowest unoccupied molecular orbital energy level ($EL_C$) of electron control material may satisfy the following equations:

$$0 \leq EH_H - EH_C \leq 0.3 \text{ eV and}$$

$$0 \leq EL_H - EL_C \leq 0.5 \text{ eV}$$

The highest occupied molecular orbital energy level ($EH_C$) of the electron control material is lower than the highest occupied molecular orbital energy level ($EH_H$) of the host material, and the difference between $EH_C$ and $EH_H$ is 0.3 eV or lower.

Since the highest occupied molecular orbital energy level ($EH_C$) of the electron control material is lower than the highest occupied molecular orbital energy level ($EH_H$) of the host material, the luminescent efficiency may increase due to the hole blocking mechanism in the high brightness region. However, due to the difference of 0.3 eV or lower, the hole blocking mechanism may be suppressed in the low brightness region and thus, luminescent efficiency may decrease.

In addition, since the lowest unoccupied molecular orbital energy level ($EL_C$) of the electron control material is lower than the lowest unoccupied molecular orbital energy level ($EL_H$) of the host material, electrons may be smoothly transported. However, due to the difference of 0.5 eV or lower, an excessive increase in driving voltage may be suppressed.

Electron mobility of the organic light-emitting device may be equal to or greater than the hole mobility of the electron control material. By doing this, electrons may smoothly flow in the electron control layer 171 including the electron control material. That is, the flow of electrons quickly moving in the electron transportation layer 173 may decrease through the electron control layer 171 (including the electron control material), and thus, the luminescent efficiency of the organic light-emitting device may decrease in the low brightness region.

A highest occupied molecular orbital energy level ($EH_C$) of the electron control material may be, for example, in a range of about −5.2 eV to about −6.1 eV, and a lowest unoccupied molecular orbital energy level ($EL_C$) of the electron control material may be in a range of about −2.5 eV to about −3.2 eV.

When the highest occupied molecular orbital energy level ($EH_C$) and the lowest unoccupied molecular orbital energy level ($EL_C$) of the electron control material are within the ranges described above, in a high brightness region, luminescent efficiency may increase due to the hole blocking mechanism, and in a low brightness region, the hole blocking mechanism may be suppressed and luminescent efficiency may decrease.

An amount of the electron control material may be in a range of about 30 wt % to about 100 wt % based on a total weight of the electron control layer 171. To obtain improved luminescent efficiency characteristics with respect to brightness due to the electron control material, an amount of the electron control material may be at a sufficient level, for example, the electron control material may be at least 30 wt % or more based on the total amount of the electron control layer 171.

The electron control layer 171 may be formed of an electron control material and a phosphorescent dopant, and an amount of the phosphorescent dopant may be in a range of about 0.1% to about 50% of the electron control material. For example, an amount of the phosphorescent dopant may be in a range of about 0.1% to about 10% of the electron control material. When an amount of the phosphorescent dopant is within the range described above, a decrease in luminescent efficiency of the organic light-emitting device in a low brightness region may be maximized.

A thickness ratio of the electron transportation layer 173 to the electron control layer 171 may be in a range of 5:1 to 5:10. The thickness ratio of the electron transportation layer 173 to the electron control layer 171 is associated with the material for forming the electron transportation layer 173 and the electron control material in the electron control layer 171, and is also associated with how much of the electron control material is used. When the thickness ratio of the electron control layer 171 to the electron transportation layer 173 satisfies the relationship described above, luminescent efficiency with respect to brightness (obtained by using the electron control material) may be appropriately controlled.

Figure 2:
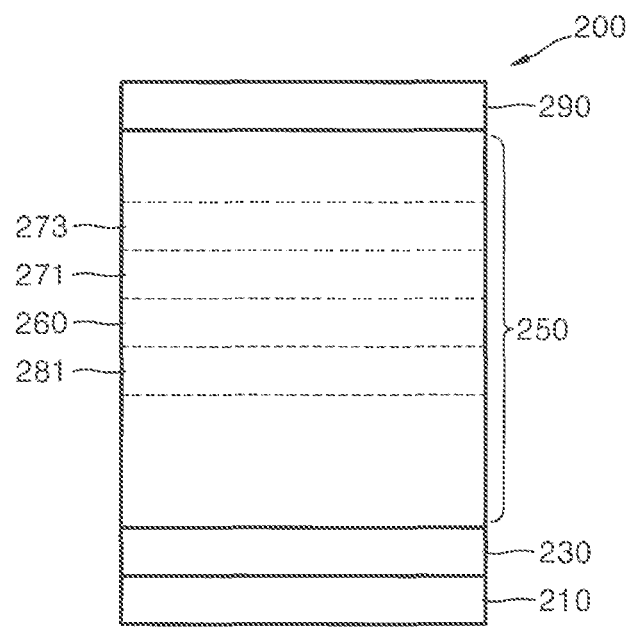
FIG. 2 is a schematic cross-sectional view of an organic light-emitting device according to another embodiment of the present invention.

FIG. 2 is a schematic cross-sectional view of an organic light-emitting device according to another embodiment of the present invention. Referring to FIG. 2, the organic light-emitting device 200 includes a substrate 210, a first electrode 230 formed on the substrate 210, a second electrode 290 facing the first electrode 230, and an organic layer 250 between the first electrode 230 and the second electrode 290.

The organic layer 250 includes an emission layer 260, an electron transportation layer 273 between the emission layer 260 and the second electrode 290, an electron control layer 271 between the emission layer 260 and the electron transportation layer 273, and an electron blocking layer 281 between the emission layer 260 and the first electrode 230. The emission layer 260 includes a phosphorescent host material and a dopant material. The electron control layer 273 includes an electron control material and a phosphorescent dopant. The electron blocking layer 281 includes an electron blocking material.

A highest occupied molecular orbital energy level ($EH_H$) of the host material, a lowest unoccupied molecular orbital energy level ($EL_H$) of the host material, a highest occupied molecular orbital energy level ($EH_C$) of the electron control material, a lowest unoccupied molecular orbital energy level ($EL_C$) of the electron control material, and a lowest unoccupied molecular orbital energy level ($EL_B$) of the electron blocking material may satisfy the following three equations:

$$|EH_H - EH_C| \leq 0.3 \text{ eV}$$

$$|EL_H - EL_C| \leq 0.5 \text{ eV and}$$

$$EL_B > EL_H$$

The highest occupied molecular orbital energy level ($EH_C$) of the electron control material is similar to the highest occupied molecular orbital energy level ($EH_H$) of the host material, with a difference between $EH_C$ and $EH_H$ being 0.3 eV or lower. When the difference between $EH_C$ and $EH_H$ is 0.3 eV or lower, the hole blocking mechanism from the emission layer to the electron control layer in a low brightness region may be suppressed.

The difference between the absolute values of the lowest unoccupied molecular orbital energy level ($EL_C$) of the electron control material and the lowest unoccupied molecular orbital energy level ($EL_H$) of the host material may be 0.5 eV or less. When the lowest unoccupied molecular orbital energy level ($EL_C$) of the electron control material and the lowest unoccupied molecular orbital energy level ($EL_H$) of the host material satisfy the relationship described above, satisfactory electron transportation capability may be obtained without an excessive increase in driving voltage.

The lowest unoccupied molecular orbital energy level ($EL_B$) of the electron blocking material is higher than the lowest unoccupied molecular orbital energy level ($EL_H$) of the host material. When the lowest unoccupied molecular orbital energy level ($EL_B$) of the electron blocking material is higher than the lowest unoccupied molecular orbital energy level ($EL_H$) of the host material, the flow of electrons from the emission layer 260 to the first electrode 230 may be suppressed.

A thickness of the electron control layer 271 including an electron control material may be in a range of about 10 Å to about 450 Å. When the thickness of the electron control layer 271 is 10 Å or more, a decrease in luminescent efficiency in the low brightness region may appropriately occur, and when the thickness of the electron control layer 271 is 450 Å or lower, an excessive increase in driving voltage may be suppressed.

In the organic light-emitting device 200 having such a structure, in the high brightness region, holes and electrons are smoothly injected and transported. In particular, the electron blocking layer 281 blocks electrons from moving to the first electrode 230 through the emission layer 260. Accordingly, the organic light-emitting device 200 has luminescent efficiency.

However, due to the electron control layer 271 of the organic light-emitting device 200, the hole blocking mechanism is suppressed in the low brightness region, and injection and transportation of electrons in the direction from the electron transportation layer 273 to the emission layer 260 may be delayed. Accordingly, in the low brightness region, a balance between electrons and holes for forming excitons in the emission layer 160 may break, thereby decreasing luminescent efficiency of the organic light-emitting device 100.

The electron blocking material may be any one of various materials that have a high lowest unoccupied molecular orbital energy level. Examples thereof include a triarylamine-based triphenylamine derivative, a carbazole derivative, and a spirodifluorene derivative. In detail, the electron blocking material may be, for example, TCTA, spiro-TAD (2,2′,7,7′-tetrakis(N,N-diphenylamino)-9,9′-spirobifluorene), or Compound 701 below. In addition, a metal complex, such as Irppz or ppz2Ir(dpm), may also be used as the electron blocking material.

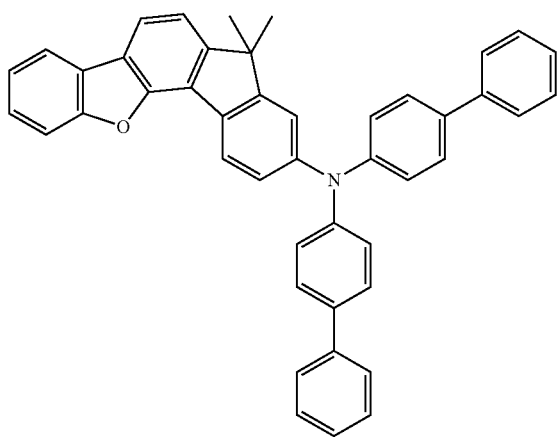

701

A thickness of the electron blocking layer may be in a range of about 10 Å to about 1000 Å. When the thickness of the electron blocking layer is 10 Å or more, satisfactory electron blocking characteristics may be obtained, and when the thickness of the electron blocking layer is 1000 k or lower, an excessive increase in driving voltage may be suppressed. For example, a thickness of the electron blocking layer may be in a range of about 50 Å to about 800 Å.

The highest occupied molecular orbital energy level ($EH_H$) of the host material, the lowest unoccupied molecular orbital energy level ($EL_H$) of the host material, the highest occupied molecular orbital energy level ($EH_C$) of the electron control material, and the lowest unoccupied molecular orbital energy level ($EL_C$) of the electron control material may satisfy the following equations:

$$0 \leq EH_H - EH_C \leq 0.3 \text{ eV and}$$

$$0 \leq EL_H - EL_C \leq 0.5 \text{ eV}$$

The highest occupied molecular orbital energy level ($EH_C$) of the electron control material is lower than the highest occupied molecular orbital energy level ($EH_H$) of the host material, with a difference between $EH_C$ and $EH_H$ being 0.3 eV or lower.

Since the highest occupied molecular orbital energy level ($EH_C$) of the electron control material is lower than the highest occupied molecular orbital energy level ($EH_H$) of the host material, luminescent efficiency may increase due to the hole blocking mechanism in the high brightness region. However, due to the difference of 0.3 eV or lower, the hole blocking mechanism may be suppressed in the low brightness region, and thus, luminescent efficiency may decrease.

In addition, since the lowest unoccupied molecular orbital energy level ($EL_C$) of the electron control material is lower than the lowest unoccupied molecular orbital energy level ($EL_H$) of the host material, electrons may be smoothly transported. However, due to the difference of 0.5 eV or lower, an excessive increase in driving voltage may be suppressed.

Electron mobility of the organic light-emitting device may be equal to or greater than the hole mobility of the electron control material. By doing this, electrons may smoothly flow in the electron control layer 271 (including the electron control material). That is, the flow of electrons quickly moving in the electron transportation layer 273 may decrease through the electron control layer 271 (including the electron control material), and thus, luminescent efficiency of the organic light-emitting device may decrease in the low brightness region.

A highest occupied molecular orbital energy level ($EH_C$) of the electron control material may be, for example, in a range of about −5.2 eV to about −6.1 eV, and a lowest unoccupied molecular orbital energy level ($EL_C$) of the electron control material may be in a range of about −2.5 eV to about −3.2 eV. When the highest occupied molecular orbital energy level ($EH_C$) and the lowest unoccupied molecular orbital energy level ($EL_C$) of the electron control material are within the ranges described above, in the high brightness region, luminescent efficiency may increase due to the hole blocking mechanism, and in the low brightness region, the hole blocking mechanism may be suppressed and luminescent efficiency may decrease.

An amount of the electron control material may be in a range of about 30 wt % to about 100 wt % based on a total weight of the electron control layer 271. To obtain improved luminescent efficiency characteristics with respect to brightness due to the electron control material, an amount of the electron control material may be at a sufficient level, for example at least 30 wt % or more based on the total amount of the electron control layer 271.

The electron control layer 271 may be formed of an electron control material and a phosphorescent dopant, and an amount of the phosphorescent dopant may be in a range of about 0.1% to about 50% of the electron control material. For example, an amount of the phosphorescent dopant may be in a range of about 0.1% to about 10% of the electron control material. When an amount of the phosphorescent dopant is within the range described above, a decrease in luminescent efficiency of the organic light-emitting device in the low brightness region may be maximized.

A thickness ratio of the electron transportation layer 273 to the electron control layer 271 may be in a range of 5:1 to 5:10. When the thickness ratio of the electron control layer 271 to the electron transportation layer 273 satisfies the relationship described above, luminescent efficiency with respect to brightness (obtained by using the electron control material) may be appropriately controlled.

An amount of the electron control material may be in a range of about 30 wt % to about 100 wt % based on a total weight of the electron control layer 171 or 271, and the electron control material may control the relationship between the highest occupied molecular orbital energy level of the electron control layer 171 or 271 and the highest occupied molecular orbital energy level of the emission layer 160 or 260, so that, in the high brightness region, the electron control material may promote injection and transportation of electrons, and in a low brightness region, may delay the injection and transportation of electrons. The electron control material may include a compound represented by Formula 1 below.

<Formula 1>

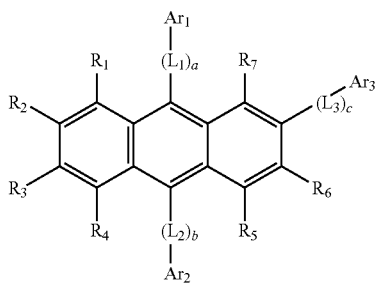

In Formula 1, $R_1$ to $R_7$ are each independently hydrogen, deuterium, halogen, a hydroxyl group, a cyano group, a nitro group, an amino group, carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, or a substituted or unsubstituted $C_6$-$C_{30}$ aryl group.

$Ar_1$, $Ar_2$, and $Ar_3$ are each independently a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, or a group represented by —N($Q_1$)($Q_2$). At least one of $Ar_1$, $Ar_2$, and $Ar_3$ in Formula 1 may be a substituted or unsubstituted $C_2$-$C_{30}$ heteroaryl group.

$L_1$, $L_2$ and $L_3$ are each independently a substituted or unsubstituted $C_6$-$C_{30}$ arylene group or a substituted or unsubstituted $C_2$-$C_{30}$ heteroarylene group.

a, b and c are each independently an integer of 0 to 3.

$Q_1$ and $Q_2$ (in the group represented by —N($Q_1$)($Q_2$)) may be each independently hydrogen, deuterium, halogen, a hydroxyl group, a cyano group, an amino group, a nitro group, carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, or a substituted or unsubstituted $C_2$-$C_{30}$ heteroaryl group.

In Formula 1, when a is 0, -($L_1$)$_a$- represents a single bond, and when a is 2 or more, the plurality of $L_1$ groups may be identical to or different from each other. Likewise, when b is 0, -($L_2$)$_b$- represents a single bond, and when b is 2 or more, the plurality of $L_2$ groups may be identical to or different from each other, and when c is 0, -($L_3$)$_c$- represents a single bond, and when c is 2 or more, the plurality of $L_3$ groups may be identical to or different from each other.

The compound represented by Formula 1 has a highest occupied molecular orbital energy level of about −5.2 eV to about −6.1 eV, and a lowest unoccupied molecular orbital energy level of about −2.5 eV to about −3.2 eV, and may have at least one $C_2$-$C_{30}$ heteroaryl group in its molecular structure to provide relatively high electron mobility.

The compound represented by Formula 1 may be included in the electron control layer 171 or 271, so that in a high brightness region, the injection and transportation of electrons may be promoted, and in a low brightness region, the injection and transportation of electrons may be delayed.

The electron control material may include at least one compound represented by one of Formulae 2 and 3 below.

<Formula 2>

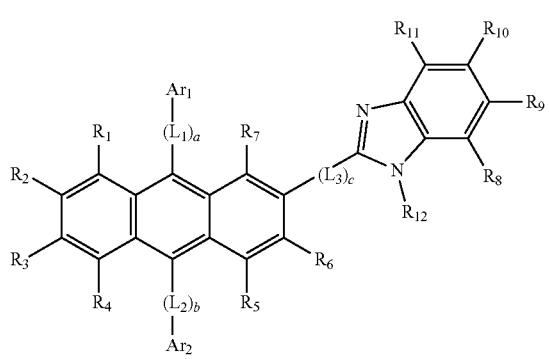

<Formula 3>

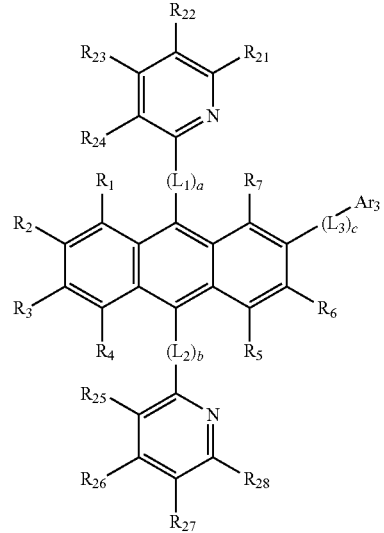

In Formulae 2 and 3, $R_1$ to $R_{12}$ and $R_{21}$ to $R_{28}$ are each independently hydrogen, deuterium, a substituted or unsubstituted methyl group, a substituted or unsubstituted ethyl group, a substituted or unsubstituted propyl group, a substituted or unsubstituted butyl group, a substituted or unsubstituted phenyl group, a substituted or unsubstituted biphenyl group, a substituted or unsubstituted naphthyl group, a substituted or unsubstituted anthryl group, a substituted or unsubstituted phenanthrenyl group, or a substituted or unsubstituted pyrenyl group.

$Ar_1$, $Ar_2$, and $Ar_3$ are each independently a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentacenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted bipyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzopuranyl group, a substituted or unsubstituted dibenzothiophenyl group, or a substituted or unsubstituted benzocarbazolyl group.

$L_1$, $L_2$ and $L_3$ are each independently a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentacenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, a substituted or unsubstituted isoxazolylene group, a substituted or unsubstituted dibenzothiophenylene group, a substituted or unsubstituted dibenzopuranylene group, a substituted or unsubstituted triazinylene group, or a substituted or unsubstituted oxadiazolylene group.

a, b, and c are each independently an integer of 0 to 1.

In Formulae 2 and 3, when a is 0, $-(L_1)_a-$ represents a single bond, when b is 0, $-(L_2)_b-$ represents a single bond, and when c is 0, $-(L_3)_c-$ represents a single bond.

The compound represented by Formulae 2 and 3 may have a highest occupied molecular orbital energy level of about −5.2 eV to about −6.1 eV and a lowest unoccupied molecular orbital energy level of about −2.5 eV to about −3.2 eV. In the case of Formula 2, due to the inclusion of a benzoimidazolyl group in its molecular structure, and in the case of Formula 3, due to the inclusion of a pyridyl group in its molecular structure, mobility of electrons is relatively high.

When the electron control layer 171 or 271 includes at least one of the compounds represented by Formulae 2 and 3, in a high brightness region, the injection and transportation of electrons may be promoted, and in a low brightness region, the injection and transportation of electrons may be delayed.

For example, the electron control material may include at least one of Compounds 1 or 2 below.

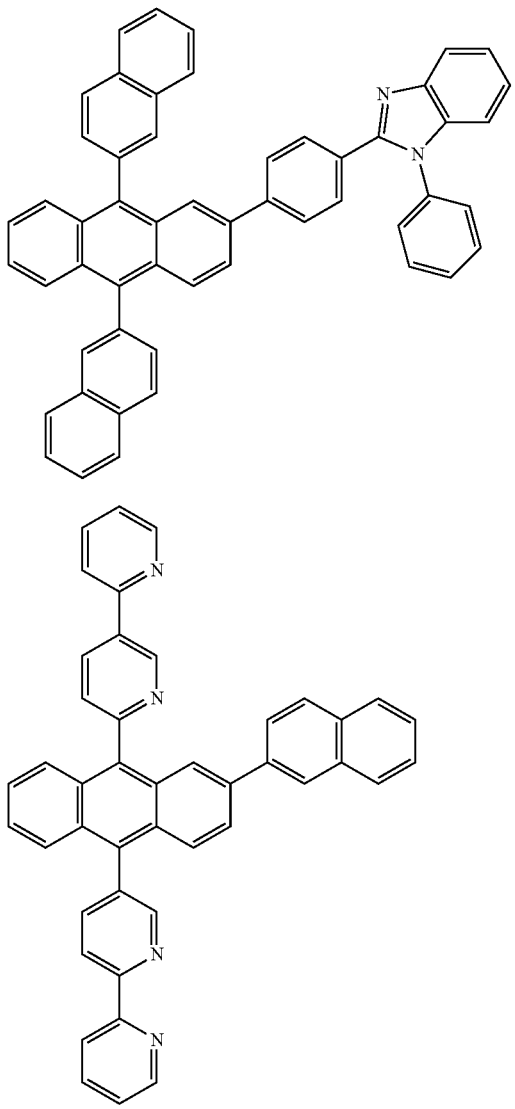

In this regard, the electron control layer 171 or 271 may include Compound 1, Compound 2, or a mixture of Compounds 1 and 2, in an amount of about 30 wt % to about 100 wt % based on a total amount of the electron control layer.

The phosphorescent dopant of the electron control material may be any one of an Ir complex, a Pt complex, a Pd complex, or an Os complex, and may be selected from known metal complexes. Detailed examples of the Ir complex, the Pt complex, the Pd complex, and the Os complex will be described later.

Figure 3:
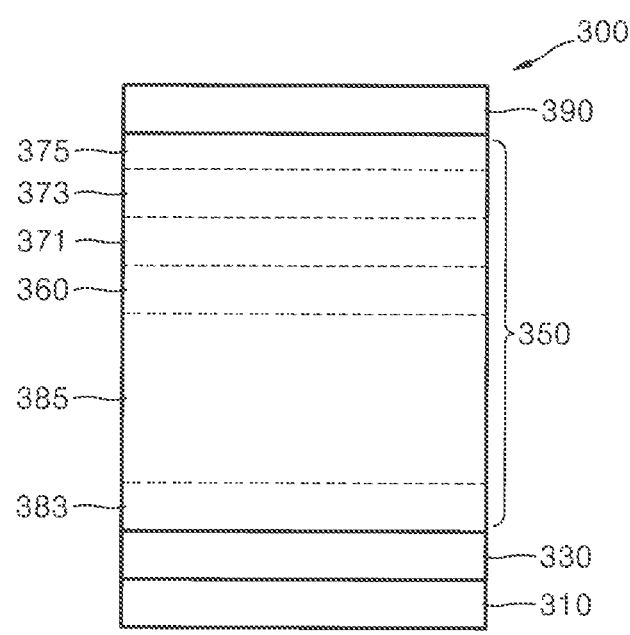
FIG. 3 is a schematic cross-sectional view of an organic light-emitting device having a substrate/first electrode/hole injection layer/hole transportation layer/emission layer/electron control layer/electron transportation layer/electron injection layer/second electrode structure, according to an embodiment of the present invention.

FIG. 3 is a schematic cross-sectional view of an organic light-emitting device 300 according to an embodiment of the present invention, and the organic light-emitting device 300 has a substrate 310/first electrode 330/hole injection layer 383/hole transportation layer 385/emission layer 360/electron control layer 371/electron transportation layer 373/electron injection layer 375/second electrode 390 structure. Hereinafter, a structure of an organic light-emitting device according to an embodiment of the present invention and a method of manufacturing the organic light-emitting device according to an embodiment of the present invention will be described in connection with FIG. 3.

The substrate 310, which may be any substrate generally used in OLEDs, may be a glass substrate or a transparent plastic substrate with good mechanical strength, thermal stability, transparency, surface smoothness, ease of handling, and water resistance.

The first electrode 330 may be formed by, for example, depositing or sputtering a material for a first electrode on the substrate 310. When the first electrode 330 is an anode, the material for forming the first electrode may be selected from materials with a high work function to enable ease of hole injection. The first electrode 330 may be a reflective electrode or a transmission electrode. The material for the first electrode may be a transparent material with high conductivity, and examples of such a material include indium tin oxide (ITO), indium zinc oxide (IZO), tin oxide ($SnO_2$), and zinc oxide (ZnO). The first electrode 330 may be formed as a reflective electrode using magnesium (Mg), silver (Ag), aluminum (Al), aluminum/lithium (Al/Li), calcium (Ca), silver/tin indium oxide (Ag/ITO), magnesium/indium (Mg/In), magnesium/silver (Mg/Ag), or the like. The first electrode 330 may have a single-layer structure or a multi-layer structure including at least two layers. For example, the first electrode 330 may have a three-layered structure of ITO/Ag/ITO, but is not limited thereto.

The organic layer 350 may be disposed on the first electrode 330. The organic layer 350 may include the hole injection layer 383, the hole transportation layer 385, a buffer layer (not shown), the emission layer 360, the electron control layer 371, the electron transportation layer 373, and the electron injection layer 375.

The hole injection layer 383 may be formed on the first electrode 330 by various methods, such as vacuum deposition, spin coating, casting, or Langmuir-Blodgett (LB) deposition. When the hole injection layer 383 is formed using vacuum deposition, the vacuum deposition may be performed at a temperature of about 100° C. to about 500° C., a pressure of about $10^{-8}$ torr to about $10^{-3}$ torr, and a deposition rate of about 0.01 to about 100 Å/sec. However, the vacuum deposition conditions may vary according to the compound that is used to form the hole injection layer and the desired structural and thermal properties of the hole injection layer to be formed. When the hole injection layer 383 is formed using spin coating, the spin coating may be performed at a coating rate of about 2000 rpm to about 5000 rpm, and the temperature at which heat treatment is performed to remove solvent after coating may be, for example, a temperature of about 80° C. to about 200° C. However, the coating conditions may vary according to the compound that is used to form the hole injection layer 383 and the desired structural and thermal properties of the hole injection layer to be formed.

As a material for forming the hole injection layer, the compound represented by Formula 6 may be used. However, the material for forming the hole injection layer is not limited thereto.

<Formula 6>

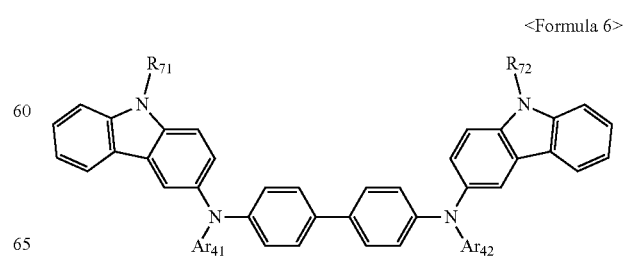

In Formula 6, $Ar_{41}$ and $Ar_{42}$ are each independently a substituted or unsubstituted $C_6$-$C_{30}$ arylene group, or a substituted or unsubstituted $C_2$-$C_{30}$ heteroarylene group.

$R_{71}$ and $R_{72}$ are each independently hydrogen, deuterium, halogen, a hydroxyl group, a cyano group, a nitro group, an amino group, an amidino group, hydrazine, hydrazone, a carboxyl group or a salt thereof, a sulfonic acid group or a salt thereof, a phosphoric acid group or a slat thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group.

For example, the material for forming the hole injection layer may be either the compound represented by Formula 6 above or a mixture of the compound represented by Formula 6 and another material for forming the hole injection layer.

The compound represented by Formula 6 may be one of Compounds 301 to 308 below, but is not limited thereto.

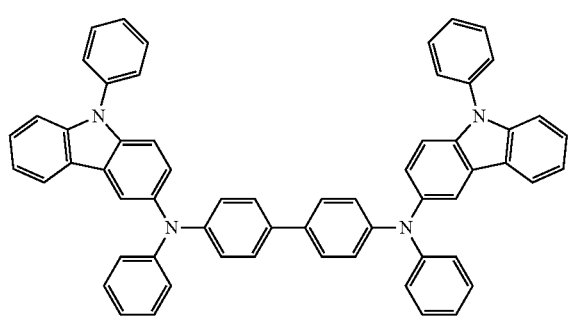

301

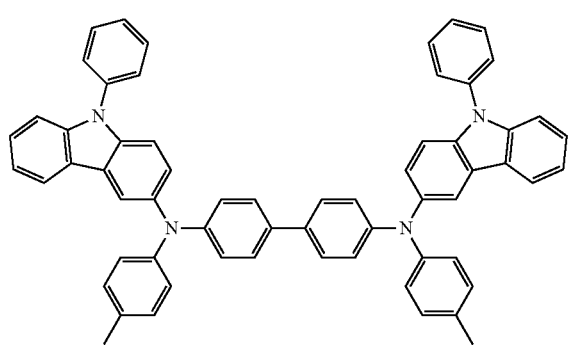

302

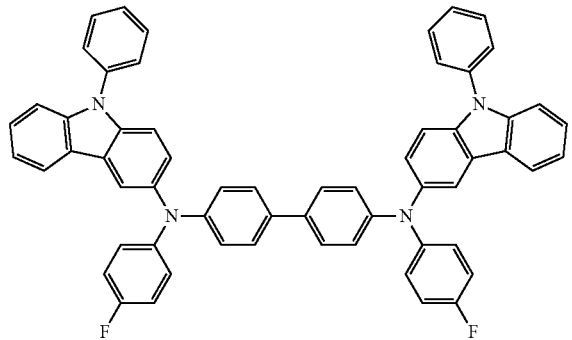

303

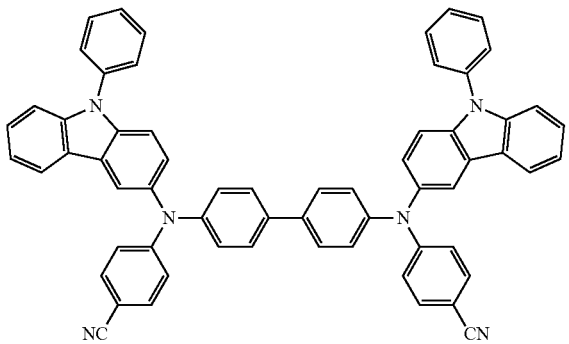

304

305

306

307

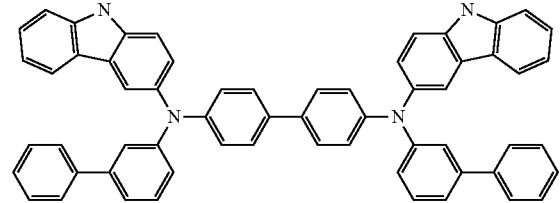

-continued

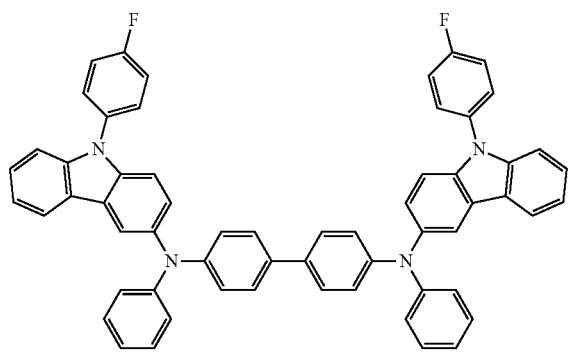

308

Nonlimiting examples of hole injection layer forming materials include N,N'-diphenyl-N,N'-bis-[4-(phenyl-m-tolyl-amino)-phenyl]-biphenyl-4,4'-diamine (DNTPD), a phthalocyanine compound, such as a copper phthalocyanine, 4,4',4''-tris (3-methylphenylphenylamino) triphenylamine [m-MTDATA], N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and (polyaniline)/poly(4-styrenesulfonate) (PANI/PSS).

A thickness of the hole injection layer 383 may be from about 100 Å to about 10000 Å, and in some embodiments, may be from about 100 Å to about 1000 Å. When the thickness of the hole injection layer 383 is within the ranges described above, the hole injection layer may have satisfactory hole injection characteristics without a substantial increase in a driving voltage.

Then, a hole transportation layer 385 may be formed on the hole injection layer 383 by vacuum deposition, spin coating, casting, Langmuir-Blodgett (LB) deposition, or the like. When the hole transportation layer 385 is formed using vacuum deposition or spin coating, the deposition or coating conditions may be similar to those used to form the hole injection layer 383, though the deposition or coating conditions may vary according to the compound that is used to form the hole transportation layer.

As a material for forming the hole transportation layer, the compound represented by Formula 5 may be used. However, the material for forming the hole injection layer is not limited thereto:

<Formula 5>

In Formula 5, $R_{50}$ may be a substituted or unsubstituted phenyl group, a substituted or unsubstituted naphthyl group, a substituted or unsubstituted anthryl group, a substituted or unsubstituted biphenyl group, or a substituted or unsubstituted pyridyl group.

$L_{21}$ may be a substituted or unsubstituted $C_1$-$C_{30}$ alkylene group, a substituted or unsubstituted $C_2$-$C_{30}$ alkenylene group, a substituted or unsubstituted $C_6$-$C_{30}$ arylene group, or a substituted or unsubstituted $C_2$-$C_{30}$ heteroarylene group.

$R_{51}$ to $R_{66}$ may each independently be hydrogen, deuterium, halogen, a hydroxyl group, a cyano group, a nitro group, carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthio group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, or a group represented by —N($Q_{11}$)($Q_{12}$).

K is an integer of 0 to 3.

$Q_{11}$ and $Q_{12}$ in —N($Q_{11}$)($Q_{12}$) may each independently be hydrogen, deuterium, halogen, a hydroxyl group, a cyano group, an amino group, a nitro group, carboxyl group, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_1$-$C_{30}$ alkylthio group, a $C_3$-$C_{30}$ cycloalkyl group, a $C_3$-$C_{30}$ cycloalkenyl group, a $C_6$-$C_{30}$ aryl group, a $C_6$-$C_{30}$ aryloxy group, a $C_6$-$C_{30}$ arylthio group, or a $C_2$-$C_{30}$ heteroaryl group.

In Formula 5, when k is 0, -($L_{21}$)$_k$- represents a single bond, and when k is 2 or more, the plurality of $L_{21}$ groups may be identical to or different from each other.

For example, the material for forming the hole transportation layer may be either the compound represented by Formula 5 above or a mixture of the compound represented by Formula 5 and another material for forming the hole transportation layer.

The compound represented by Formula 5 may be one of Compounds 309 to 320 below, but is not limited thereto.

309

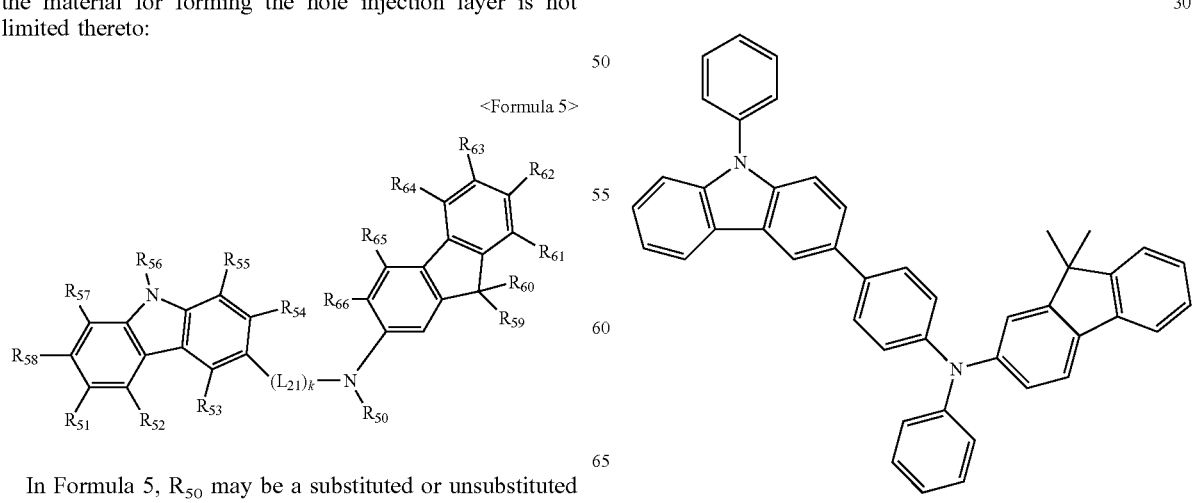

310
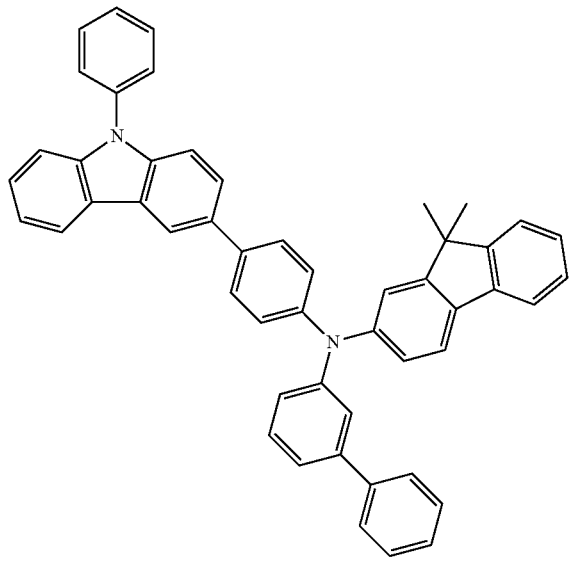
311
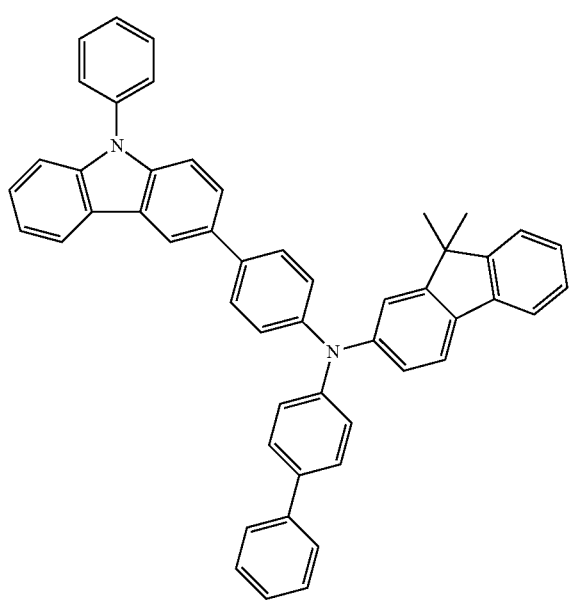
312
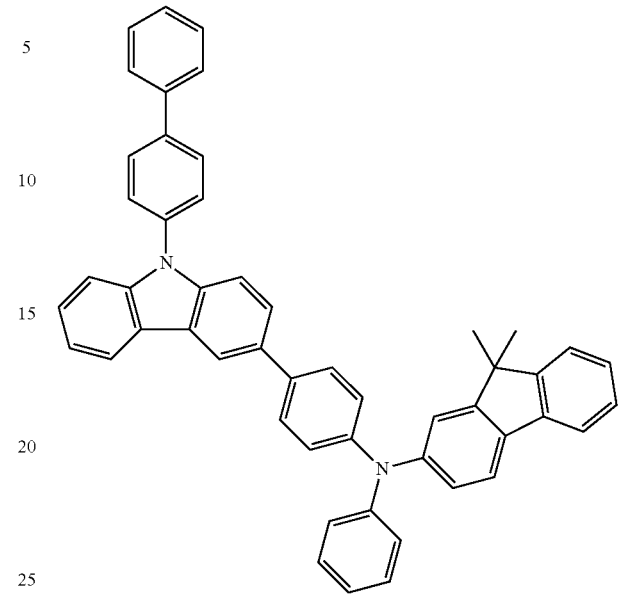
313
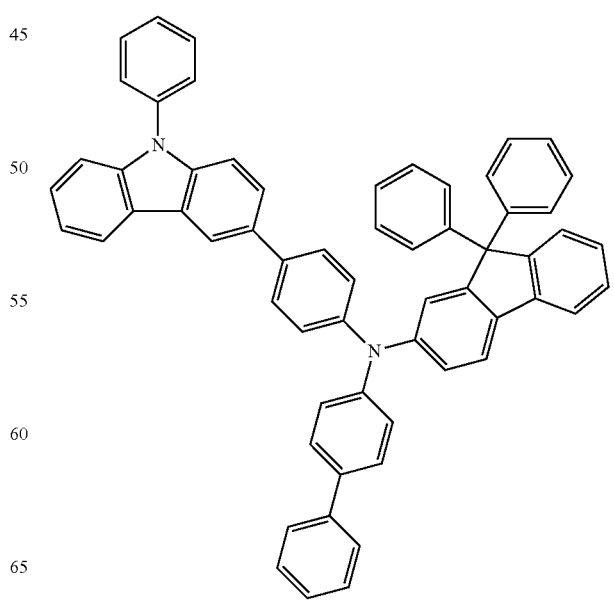

314
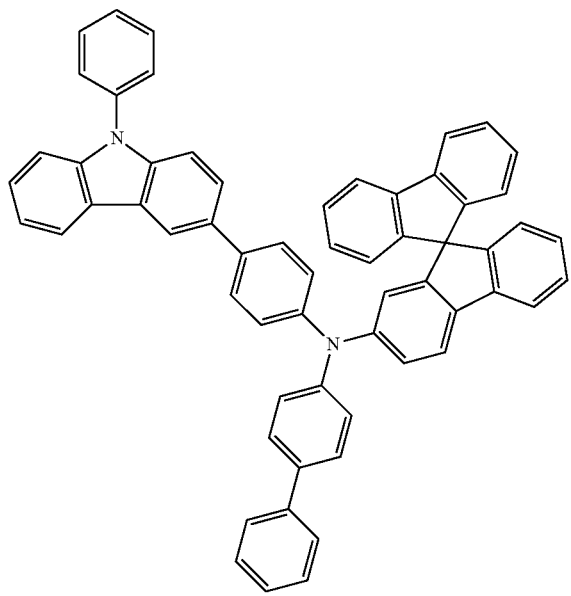
315
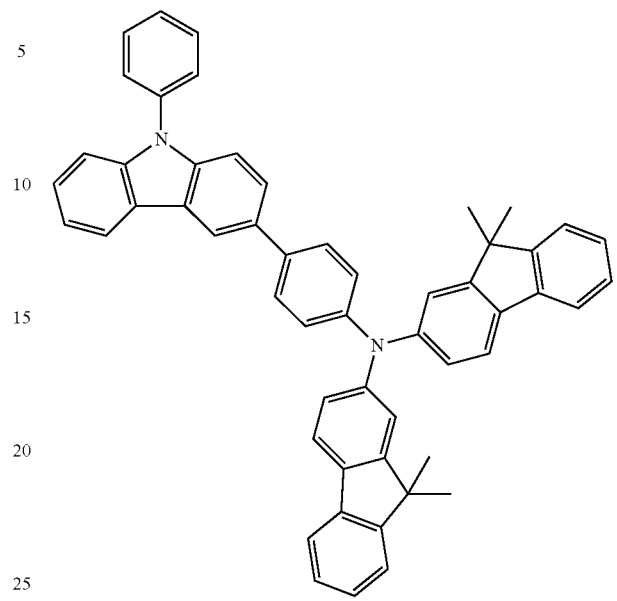
316
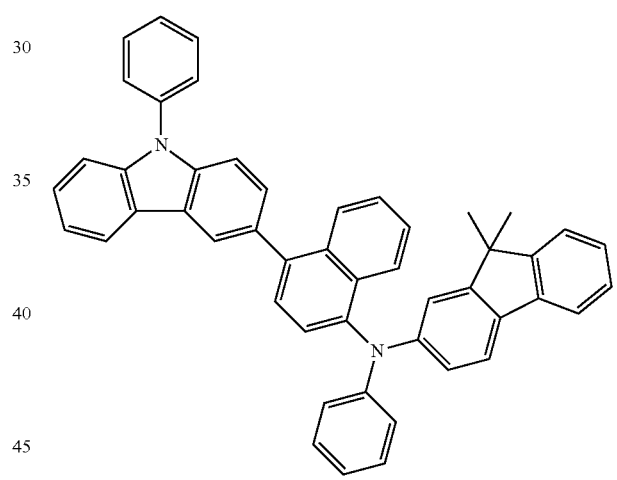
314
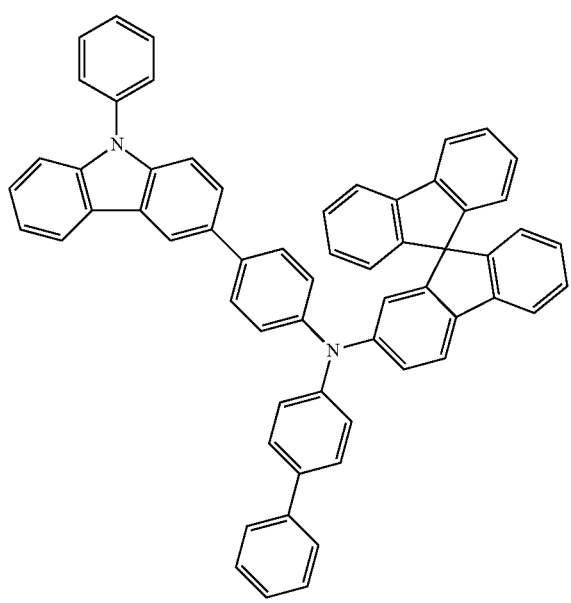
317
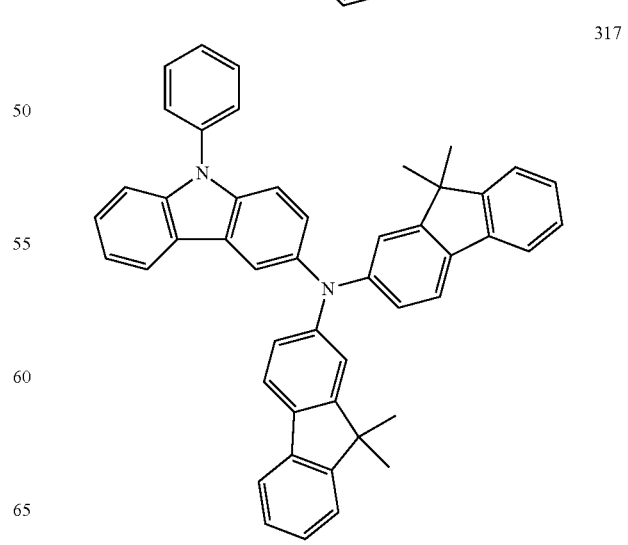

318

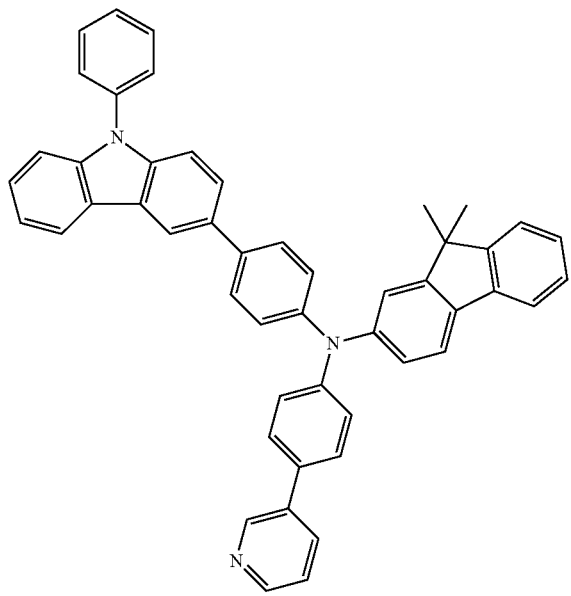

319

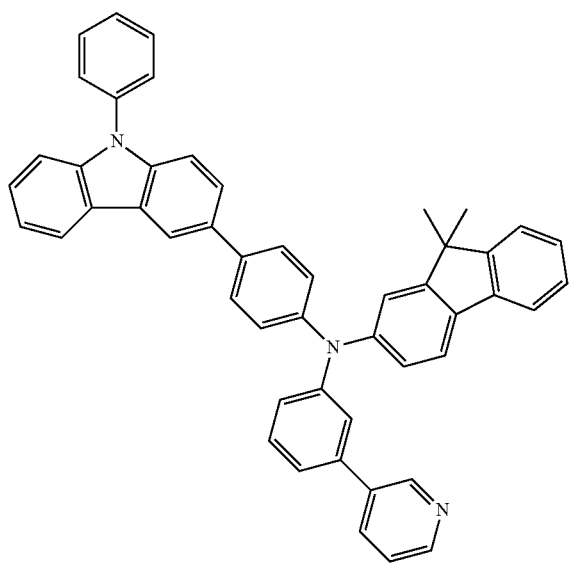

320

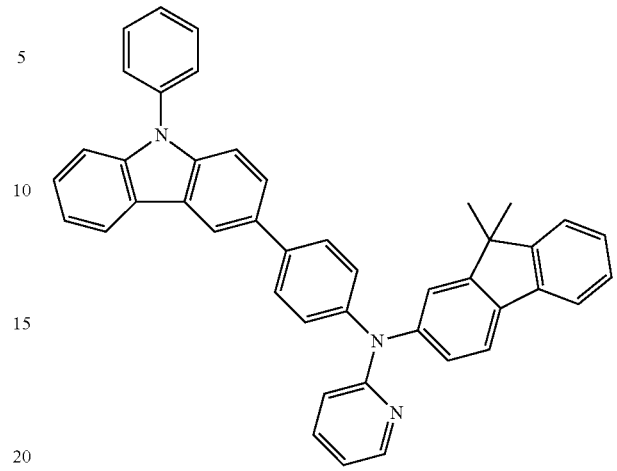

Nonlimiting examples of hole transportation layer forming materials include a carbazole derivative, such as N-phenylcarbazole, or polyvinylcarbazole, N,N'-bis(3-methylphenyl)-N,N'-diphenyl-[1,1-biphenyl]-4,4'-diamine (TPD), 4,4', 4"-tris(N-carbazolyl)triphenylamine (TCTA), N,N'-di(1-naphthyl)-N,N'-diphenylbenzidine (NPB), or the like. A thickness of the hole transportation layer 385 may be from about 50 Å to about 2000 Å, and in some embodiments, may be from about 100 Å to about 1500 Å. When the thickness of the hole transportation layer 385 is within the ranges described above, the hole transportation layer may have satisfactory hole transportation characteristics without a substantial increase in a driving voltage.

According to an embodiment of the present invention, only one of the hole injection layer 383 and the hole transportation layer 385 may be formed on the first electrode 330, and the other one may not be formed. According to another embodiment of the present invention, at least one of the hole injection layer 383 and the hole transportation layer 385 may have a multi-layer structure. According to another embodiment of the present invention, a functional layer (not shown) having hole injection capability and hole transportation capability (instead of the hole injection layer and the hole transportation layer) may be formed on the first electrode 330. The functional layer (not shown) having hole injection capability and hole transportation capability may be formed using at least one compound represented by Formula 5, a mixture of the compound represented by Formula 5 and a material for forming a hole transportation layer, the compound represented by Formula 6, and a mixture of the compound represented by Formula 6 and a material for forming the hole injection layer. A thickness of the functional layer may be in a range of about 500 Å to about 10000 Å, for example about 100 Å to about 1000 Å. When the thickness of the functional layer (not shown) having hole injection capability and hole transportation capability is within the ranges described above, satisfactory hole injection and transportation characteristics may be obtained without a substantial increase in a driving voltage.

The emission layer 360 may be formed on the hole transportation layer 385, or the functional layer (not shown) having hole injection capability and hole transportation capability by vacuum deposition, spin coating, casting, LB deposition, or the like. When the emission layer 360 is formed using vacuum deposition or spin coating, the deposition or coating conditions may be similar to those used to form the hole injection layer, though the conditions for deposition or coating may vary according to the material that is used to form the emission layer.

As the host material for the emission layer 360, a bipolar compound having a hole transportation unit and an electron transportation unit may be used. The hole transportation unit is a unit having a functional group with good hole transportation capability, and examples thereof include a unit including a fluorene derivative, a unit including a carbazole derivative, a unit including a dibenzothiophene derivative, and a unit including a dibenzofuran derivative. The electron transportation unit is a unit having a functional group with good electron transportation capability, and examples thereof include a unit including a pyridine derivative, a unit including a pyrimidine derivative, and a unit including a triazine derivative. When the bipolar compound having a hole transportation unit and an electron transportation unit is used as the host material, holes and electrons in the host material may be imbalanced in a low brightness region due to the electron control layer 371, thereby decreasing luminescent efficiency.

According to another embodiment of the present invention, as the host material of the emission layer 360, a mixture of the bipolar compound having the hole transportation unit and the electron transportation unit and at least the hole transportation unit may be used. When the hole transportation unit is additionally included in addition to the bipolar compound, hole characteristics of the host material may increase. Thus, in a low brightness region, the imbalance between holes and electrons in the host material may increase, thereby promoting a decrease in luminescent efficiency. A mixing ratio of the bipolar compound to the additional hole transportation unit in the mixed compound may be in a range of 1:1 to 1:9. When the mixing ratio of the bipolar compound to the additional hole transportation unit in the mixed compound is within the range described above, the imbalance between holes and electrons in the host material may further increase.

For example, the host material may be one of Compounds 501 to 509.

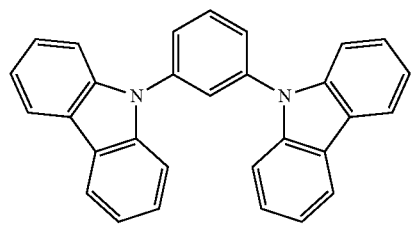

501

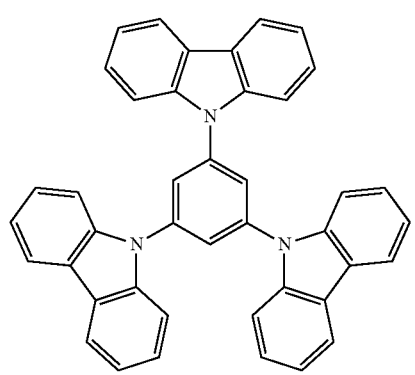

502

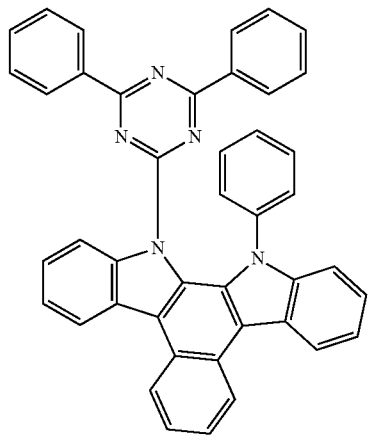

503

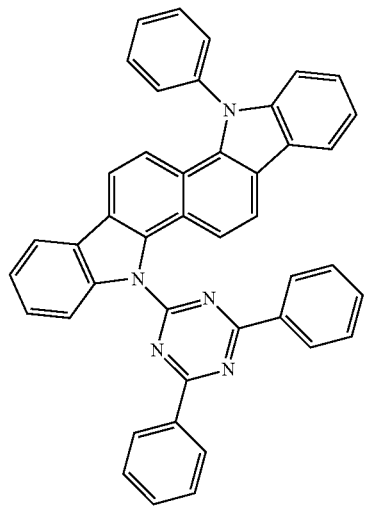

504

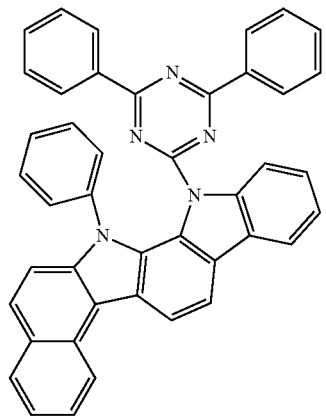

505

506
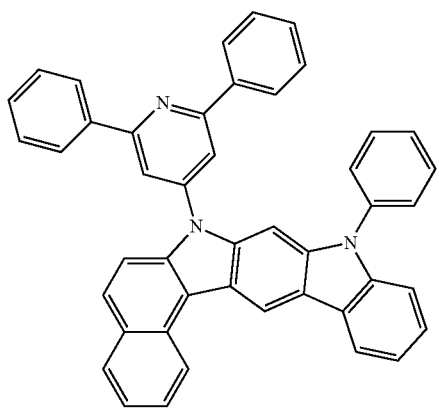

508
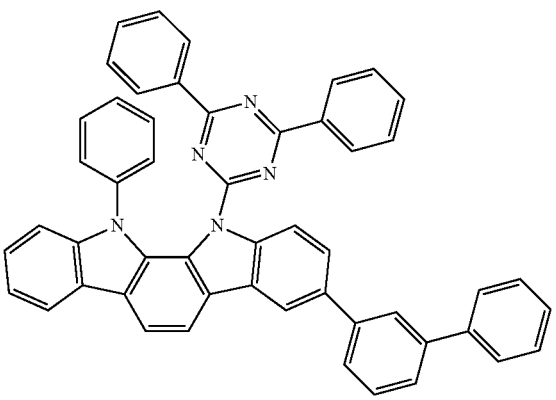

509
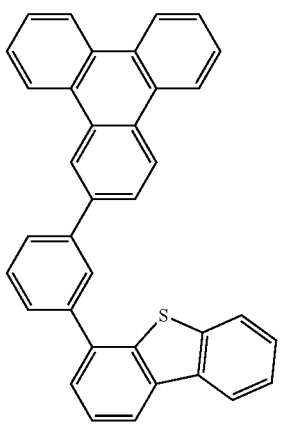

507
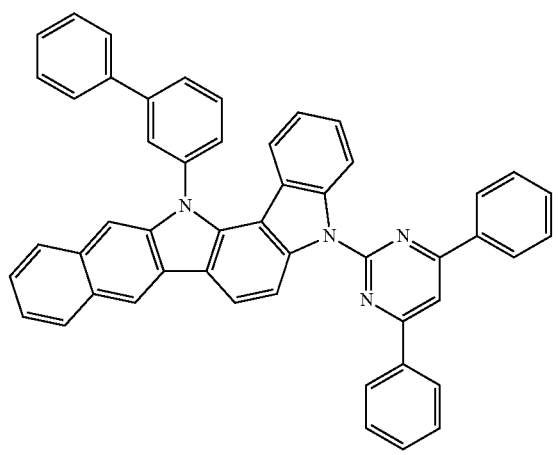

The emission layer 360 may be patterned into a red emission layer, a green emission layer, or a blue emission layer. At least one of the red emission layer, the green emission layer, and the blue emission layer may include the dopants illustrated below (ppy=phenylpyridine). From among those dopants, a complex including a metal (for example, Ir, Pt, Pd, Os, or the like) may be included in the electron control layer of an organic light-emitting device according to an embodiment of the present invention.

For example, the compounds illustrated below may be used as a blue dopant, but the blue dopant is not limited thereto.

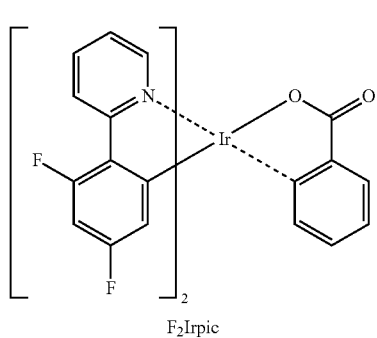
F₂Irpic

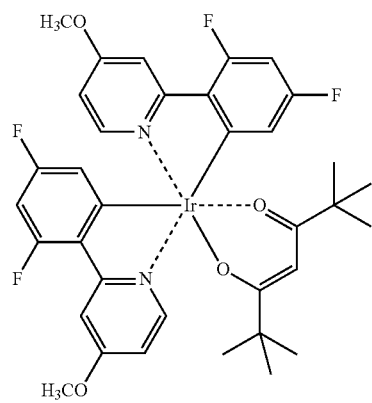
(F₂ppy)₂Ir(tmd)

-continued
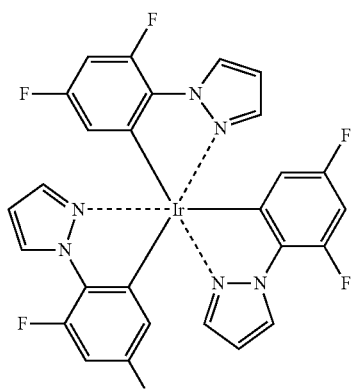
Ir(dfppz)₃
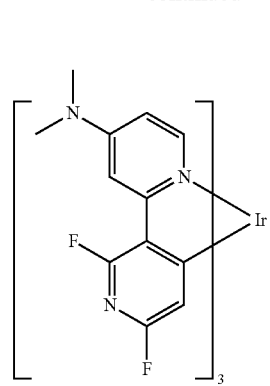
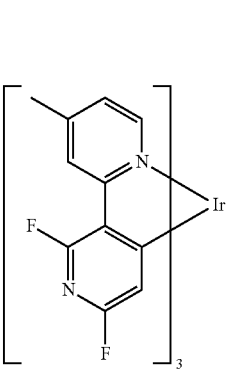
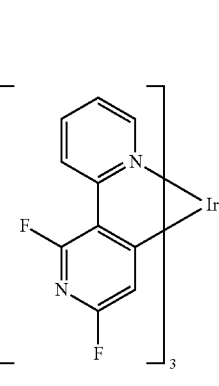
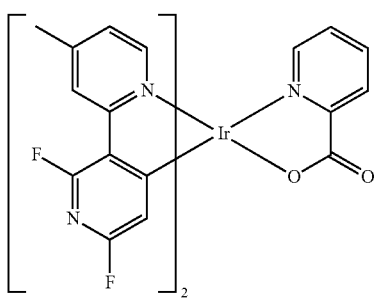
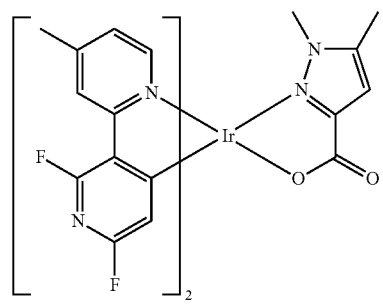
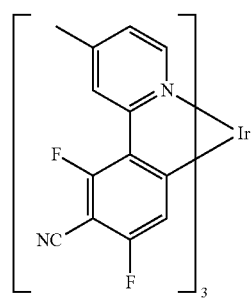
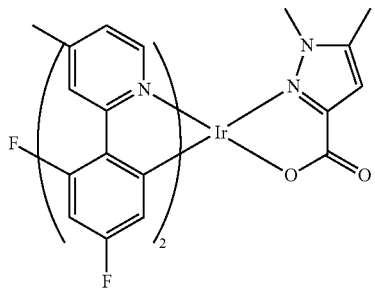
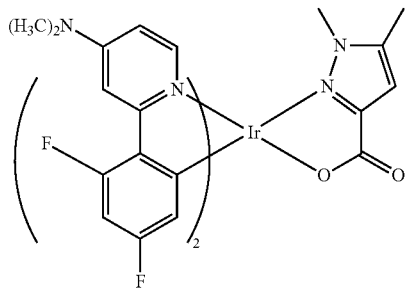
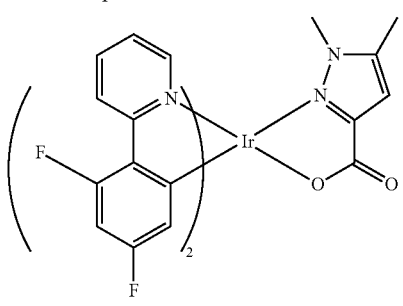
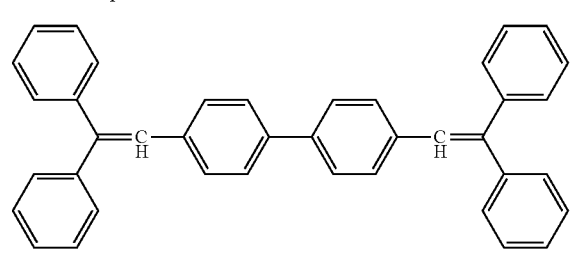
DPVBi
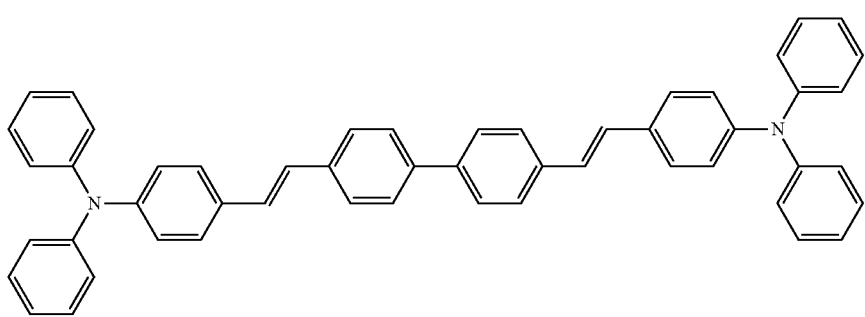
DPAVBi

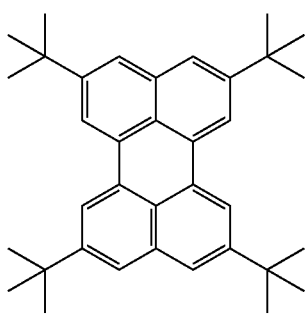
TBPe
For example, the compounds illustrated below may be used as a red dopant, but the red dopant is not limited thereto.
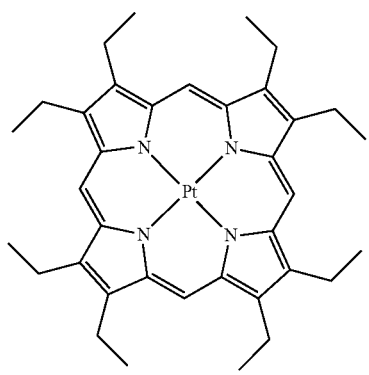
PtOEP
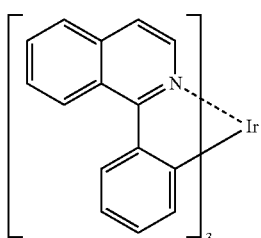
Ir(piq)₃
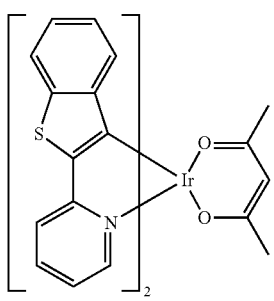
Btp₂Ir(acac)
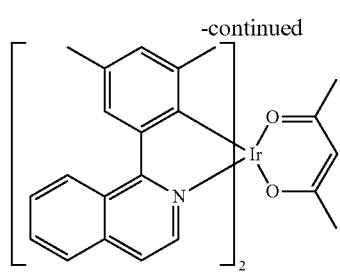
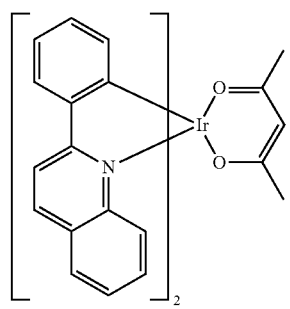
Ir(pq)₂(acac)
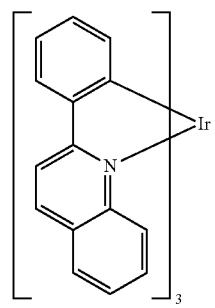
Ir(2-phq)₃
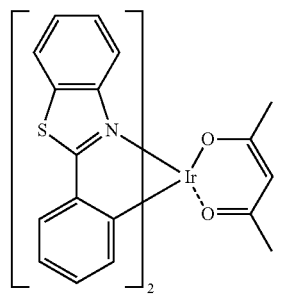
Ir(BT)₂(acac)

-continued
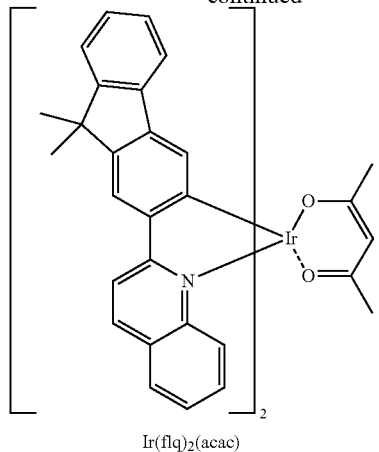
Ir(flq)₂(acac)
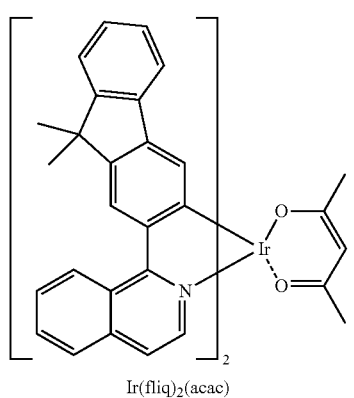
Ir(fliq)₂(acac)
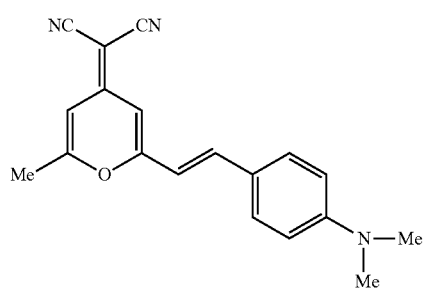
DCM
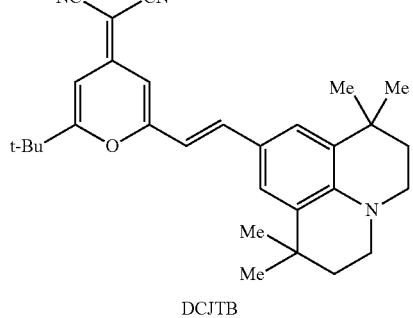
DCJTB
For example, the compounds illustrated below may be used as a red dopant, but the red dopant is not limited thereto.
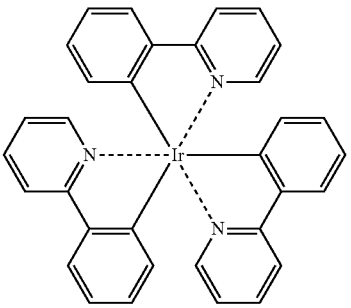
Ir(ppy)₃
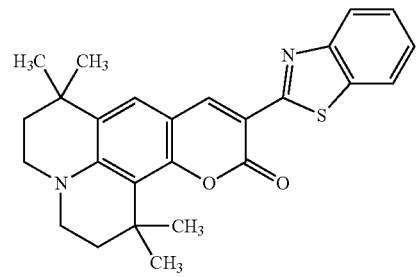 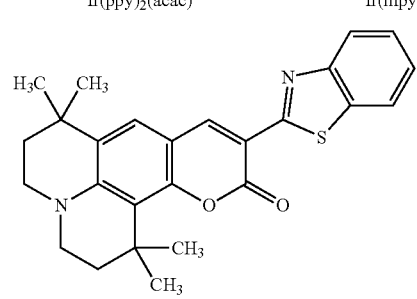
Ir(ppy)₂(acac)  Ir(mpyp)₃
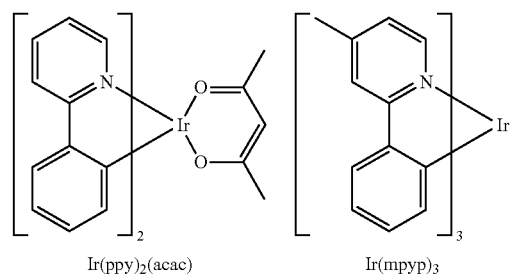
C545T
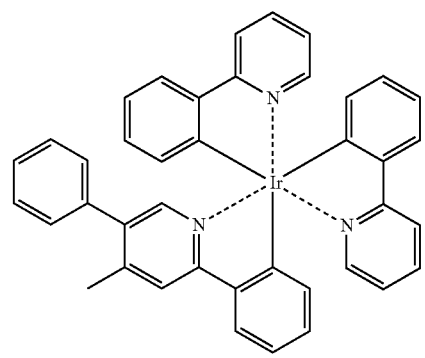
402
Non-limiting examples of the dopant that may be used in the emission layer 360 include Pd complexes and Pt complexes represented by the following formulae.
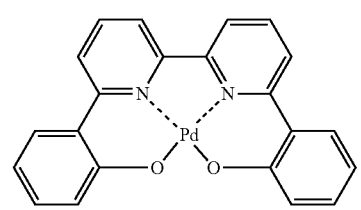
D1

-continued
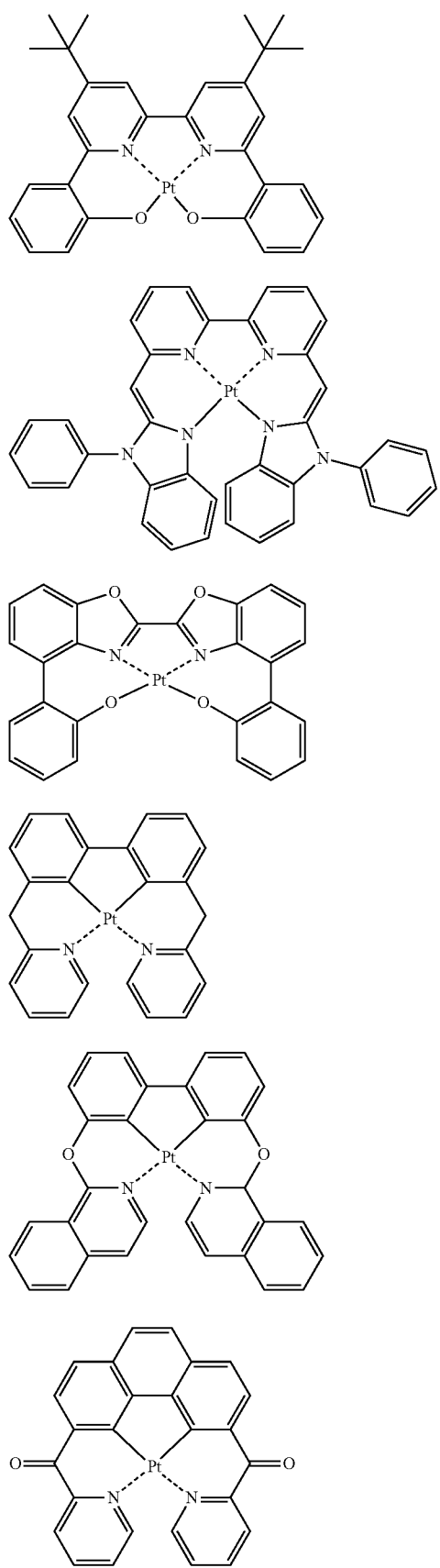
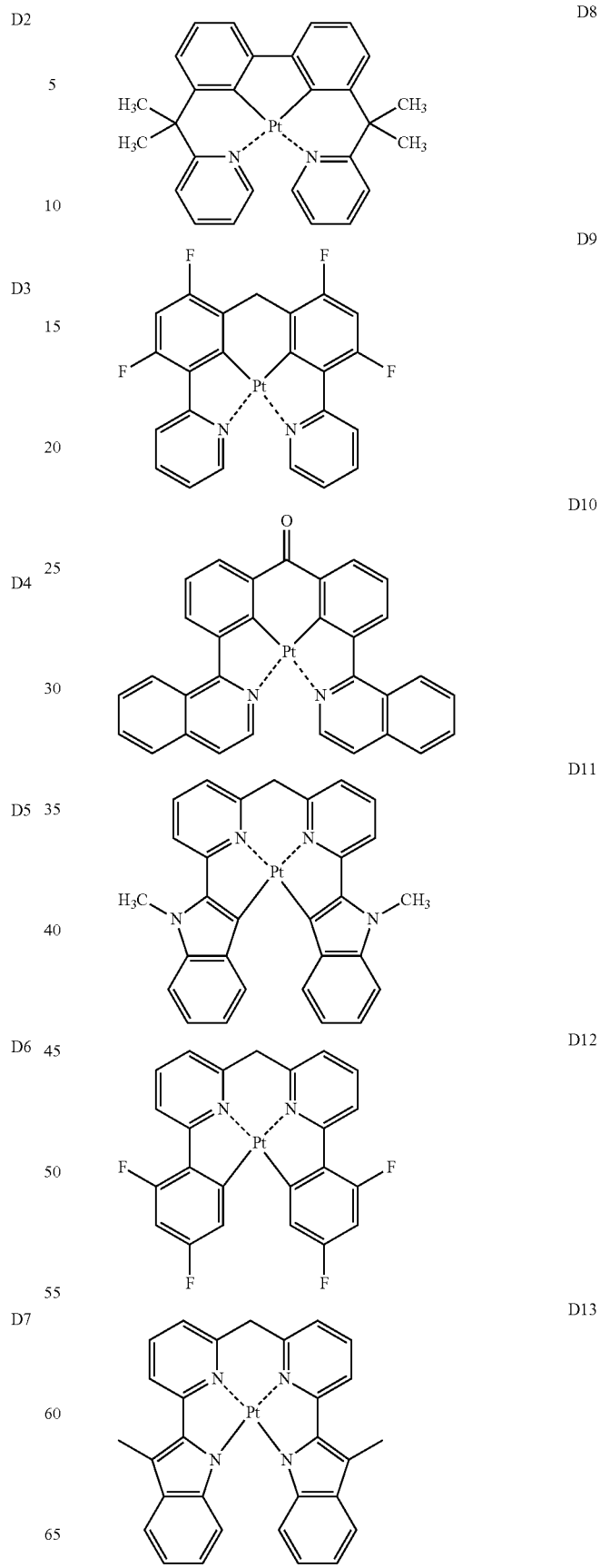

-continued
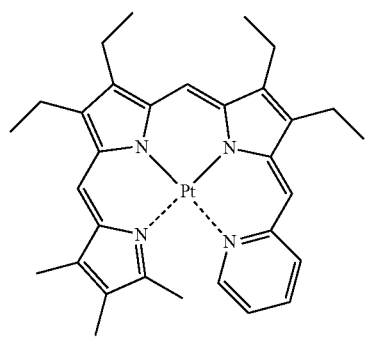
D14
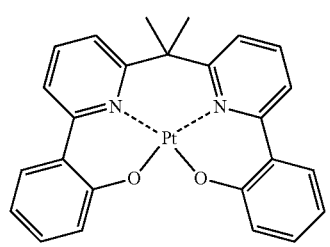
D15
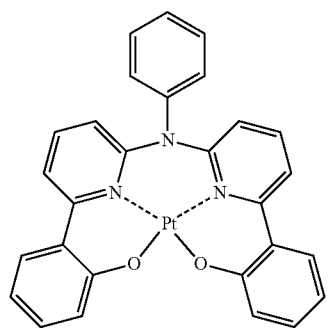
D16
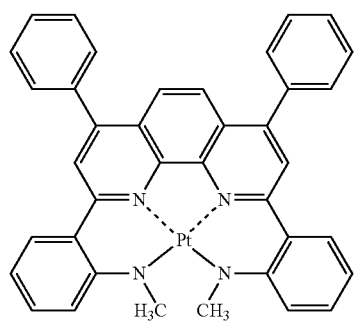
D17
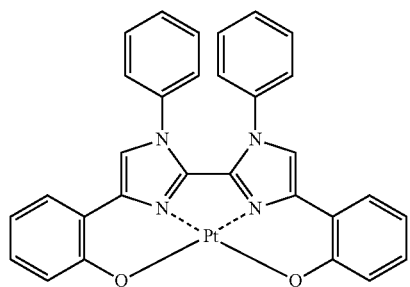
D18
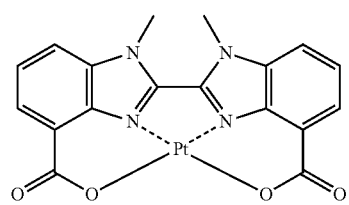
D19
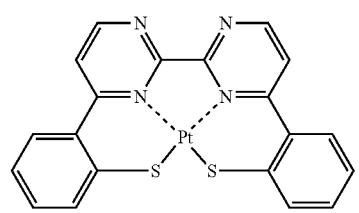
D20
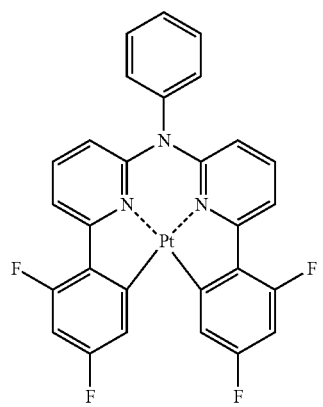
D21
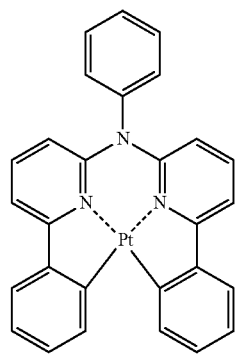
D22
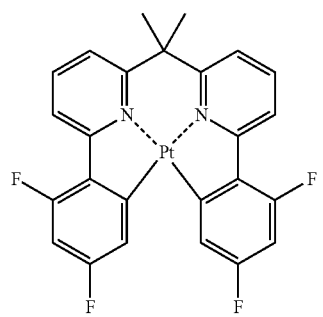
D23

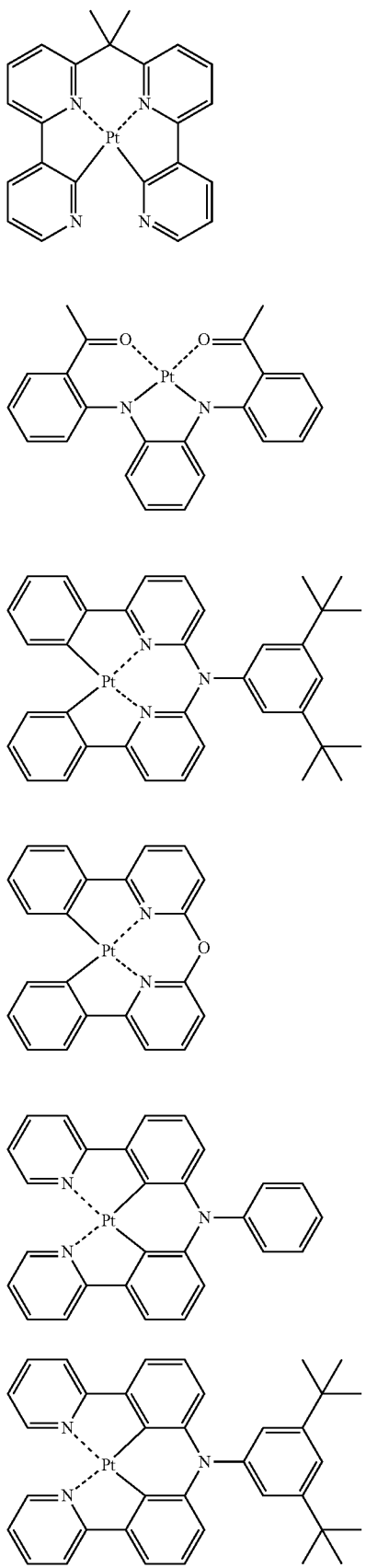
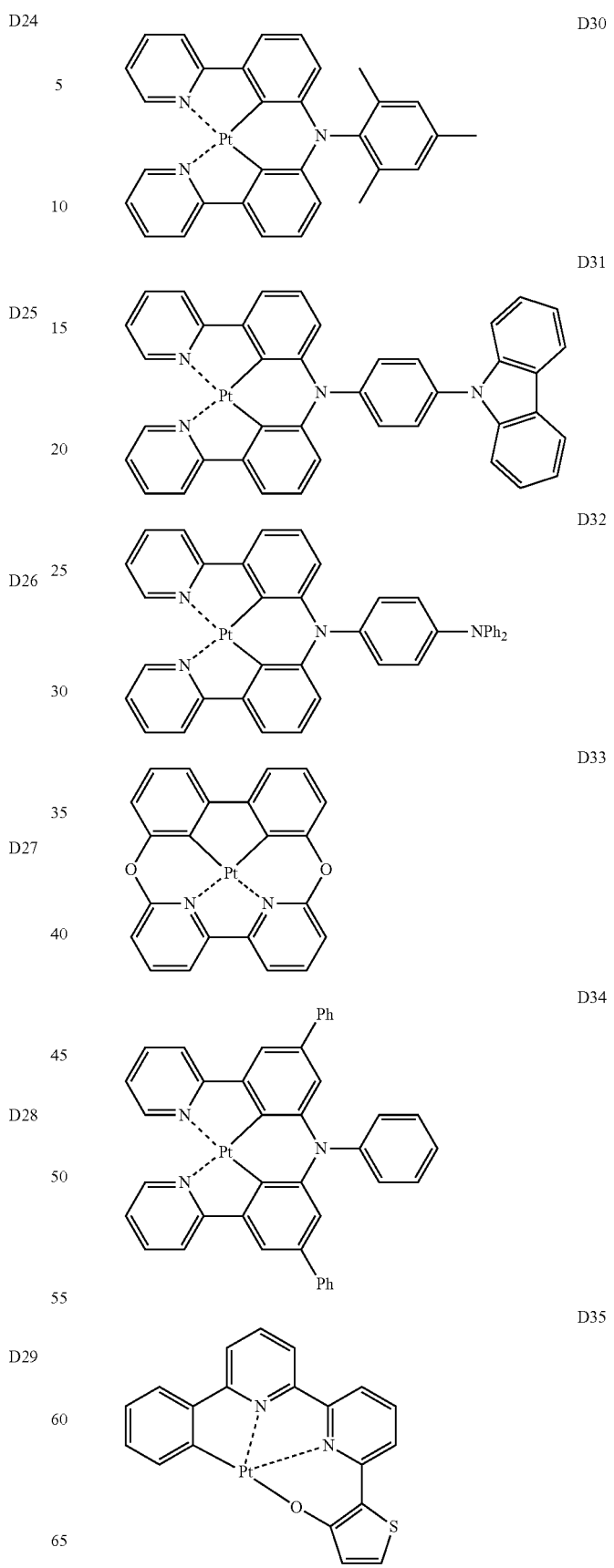

D36 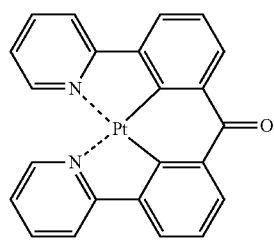
D37 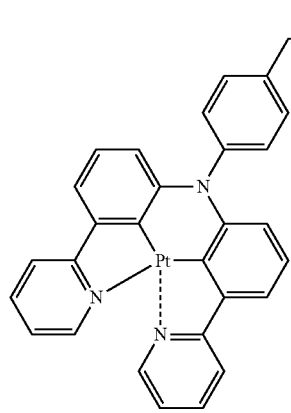
D38 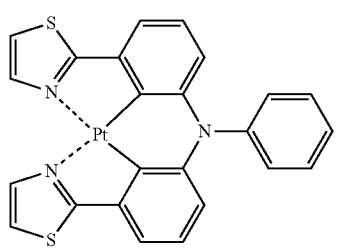
D39 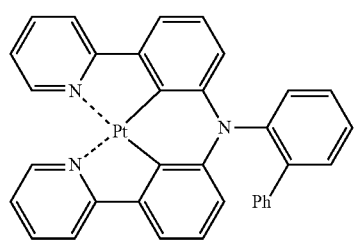
D40 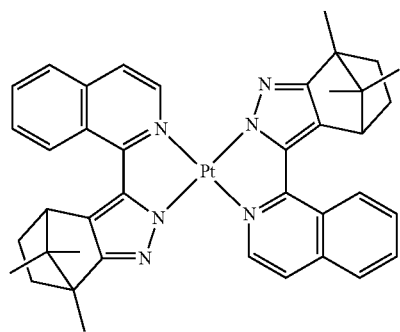
D41 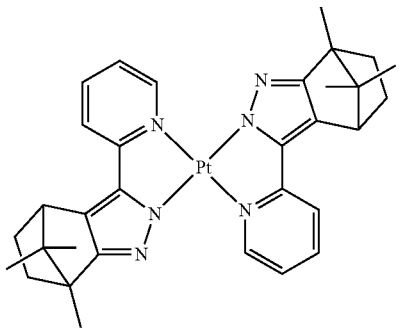
D42 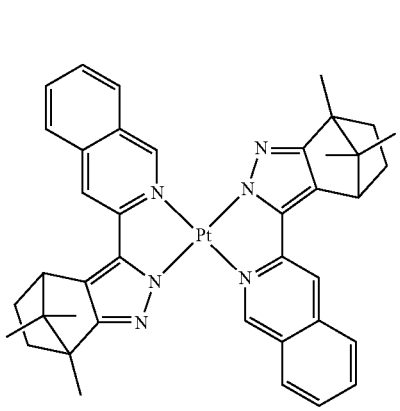
D43 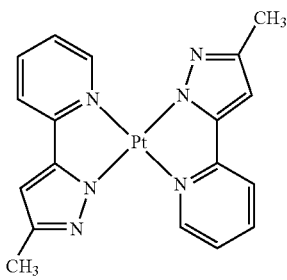
D44 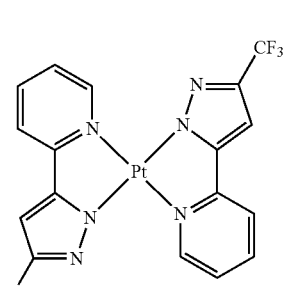
D45 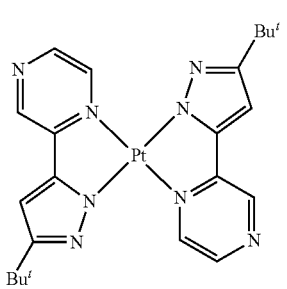

-continued

D46

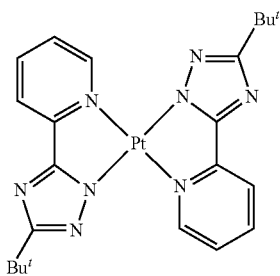

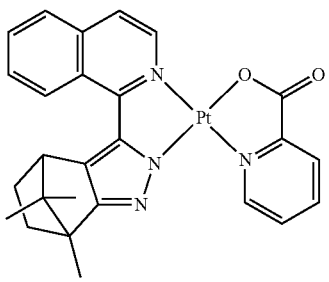

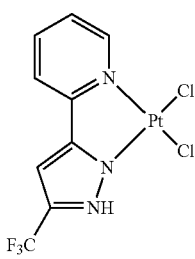

D47

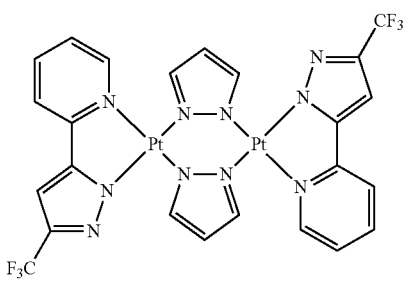

D48

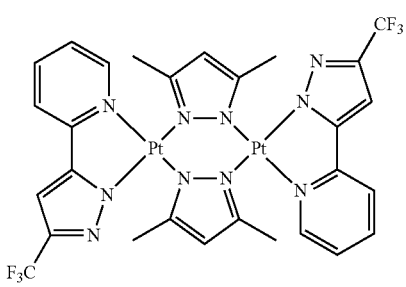

D49

D50

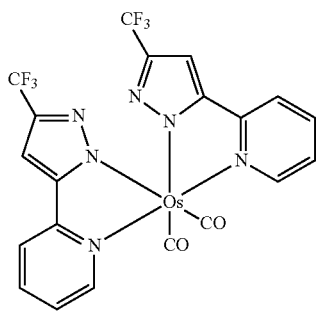

Os(fppz)₂(CO)₂

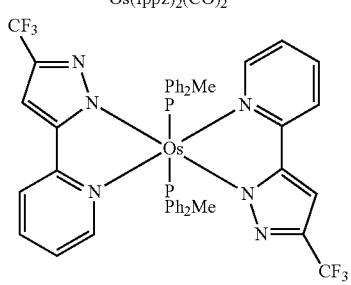

Os(fppz)₂(PPh₂Me)₂

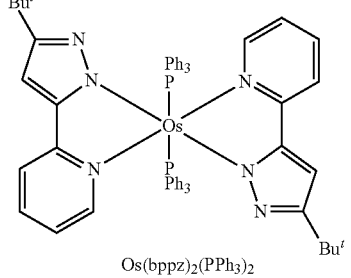

Os(bppz)₂(PPh₃)₂

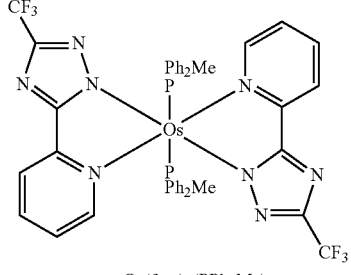

Os(fptz)₂(PPh₂Me)₂

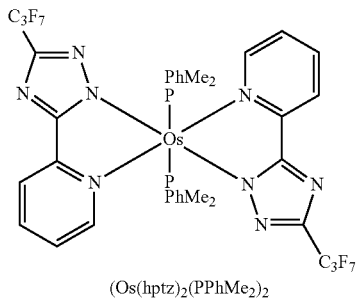

(Os(hptz)₂(PPhMe₂)₂

The dopants may be included in the electron control layer of an organic light-emitting device according to an embodiment of the present invention.

Non-limiting examples of the dopant that may be used in the emission layer 360 include Os complexes represented by the following formulae.

The dopants may be included in the electron control layer of an organic light-emitting device according to an embodiment of the present invention.

When the emission layer 360 includes both a host material and a dopant material, the amount of the dopant material may be from about 0.01 parts to about 25 parts by weight based on 100 parts by weight of the host material. However, the amount of the dopant material is not limited to this range.

A thickness of the emission layer 360 may be from about 100 Å to about 1000 Å, and in some embodiments, may be from about 100 Å to about 600 Å. When the thickness of the emission layer 360 is within these ranges, the emission layer 360 may have improved light emitting ability without a substantial increase in driving voltage.

Next, an electron control layer 371 is formed on the emission layer 360 using various methods, for example, vacuum deposition, spin coating, casting, or the like. When the electron control layer 371 is formed using vacuum deposition or spin coating, the deposition or coating conditions may be similar to those used to form the hole injection layer 383, though the conditions for deposition or coating may vary according to the material that is used to form the electron control layer. As a material for forming the electron control layer 371, an electron control material that satisfies the molecular orbital energy level relationships described above may be used. A thickness of the electron control layer 371 may be in a range of about 50 Å to about 450 Å, and a thickness ratio of the electron transportation layer 373 to the electron control layer 371 may be in a range of 5:1 to 5:10.

The electron transportation layer 373 is formed on the electron control layer 371 using various methods, for example, vacuum deposition, spin coating, casting, or the like. When the electron transportation layer 373 is formed using vacuum deposition or spin coating, the deposition or coating conditions may be similar to those used to form the hole injection layer 383, though the conditions for deposition and coating may vary according to the material that is used to form the electron transportation layer. As a material for forming the electron transportation layer, a compound represented by Formula 4 (below) which stably transports electrons injected from the electron injection electrode (cathode) may be used. However, the material for forming the electron transportation layer is not limited thereto.

<Formula 4>

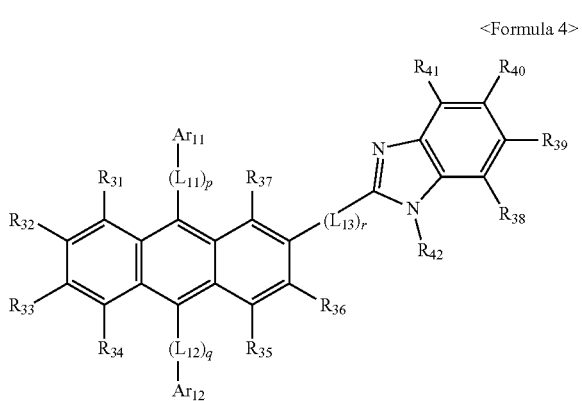

In Formula 4, $R_{31}$ to $R_{42}$ are each independently hydrogen, deuterium, a substituted or unsubstituted methyl group, a substituted or unsubstituted ethyl group, a substituted or unsubstituted propyl group, a substituted or unsubstituted butyl group, a substituted or unsubstituted phenyl group, a substituted or unsubstituted biphenyl group, a substituted or unsubstituted naphthyl group, a substituted or unsubstituted anthryl group, a substituted or unsubstituted phenanthrenyl group, or a substituted or unsubstituted pyrenyl group.

$Ar_{11}$ and $Ar_{12}$ are each independently a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentacenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted bipyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted benzoquinolinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isooxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzofuranyl group, a substituted or unsubstituted dibenzothiophenyl group, or a substituted or unsubstituted benzocarbazolyl group.

$L_{11}$, $L_{12}$, and $L_{13}$ are each independently a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenalenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentacenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, a substituted or unsubstituted isoxazolylene group, a substituted or unsubstituted dibenzothiophenylene group, a substituted or unsubstituted dibenzofuranylene group, a substituted or unsubstituted triazinylene group, or a substituted or unsubstituted oxadiazolylene group.

p, q, and r are each independently an integer of 0 to 1.

In Formula 4, when p, q, and r are each independently 0, -(L$_{11}$)$_p$-, -(L$_{12}$)$_q$- and -(L$_{13}$)$_r$- each represent a single bond.

For example, the material for forming the electron transportation layer may be either the compound represented by Formula 4 above or a mixture of the compound represented by Formula 4 and another material for forming the electron transportation layer.

The compound of Formula 4 may be Compound 201 below, but is not limited thereto.

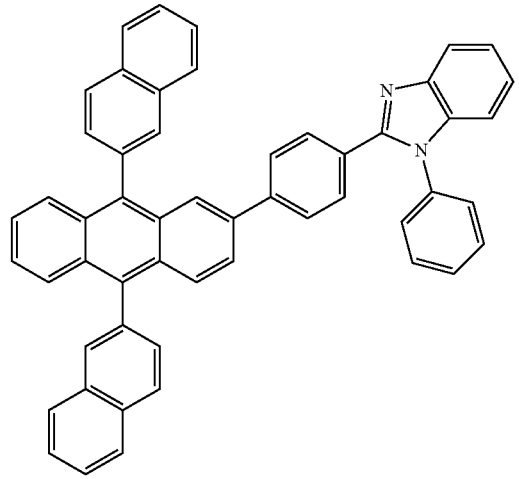

201

Nonlimiting examples of electron transportation layer forming materials include a quinoline derivative, such as tris(8-quinolinorate)aluminum (Alq3), TAZ, Balq, beryllium bis(benzoquinolin-10-olate) (Bebq$_2$), and ADN.

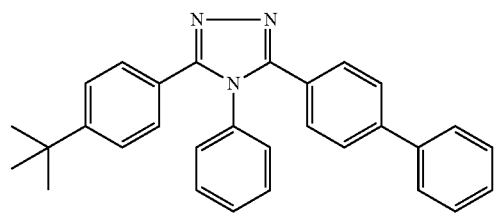

TAZ

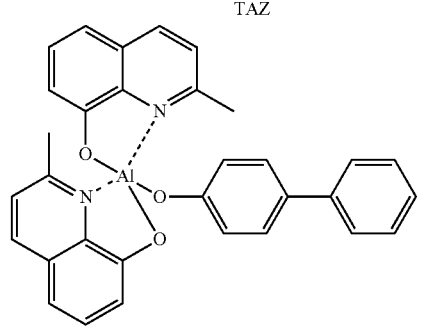

BAlq

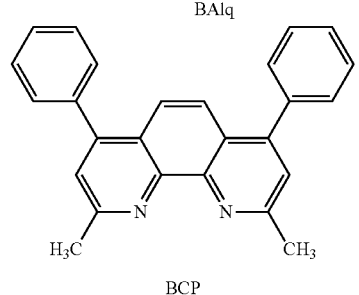

BCP

A thickness of the electron transportation layer 373 may be from about 50 Å to about 1000 Å, and in some embodiments, may be from about 100 Å to about 500 Å. When the thickness of the electron transportation layer 373 is within the ranges described above, the electron transportation layer 373 may have satisfactory electron transportation characteristics without a substantial increase in a driving voltage.

The electron transportation layer 373 may further include, in addition to the compound represented by Formula 4, a metal-containing compound. The metal-containing compound may be a metal complex represented by Formula 5 below.

In Formula 5, M is an alkali metal, and L is an aromatic compound selected from anthracene, naphthalene, diphenylanthracene, terphenyl, quaterphenyl, quinquephenyl, sexiphenyl, quinolinol, benzoquinolinol, acridinol, hydroxyphenyloxazole, hydroxyphenylthiazole, hydroxydiaryloxadiazole, hydroxydiarylthiadiazole, hydroxyphenylpyridine, hydroxyphenylbenzimidazole, hydroxybenzotriazole, hydroxyfluorene, bipyridyl, phenanthroline, phthalocyanine, porphyrin, and derivatives thereof.

For example, M may be Li. The Li complex may be, for example, lithium quinolate (LiQ) or Compound 101 below.

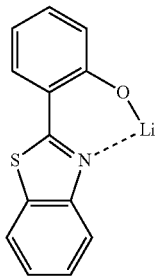

101

The electron transportation layer 373 may further include, in addition to the compound represented by Formula 4, at least one selected from 1,4,5,8,9,12-hexaazatriphenylene hexacarbonitrile, tetracyanoquinodimethane, anthraquinone, perylenebisimide, and tetracyanoanthraquinodimethane.

The electron transportation layer 373 may further include, in addition to the compound represented by Formula 4, at least one selected from: at least one metal selected from Li, Cs, Na, K, Ca, Mg, Ba, or Ra; a metal carbonate; a metal acetate; a metal benzoate; a metal acetoacetate; a metal acetylacetonate; or a metal stearate.

When the electron transportation layer 373 further includes, in addition to the compound represented by Formula 4, the materials described above, the electron injection capability and electron transportation capability may improve.

The electron injection layer 375 may be stacked on the electron transportation layer 373 which allows electrons to be easily injected from the cathode, and the material for forming the electron injection layer is not particularly limited.

The material for forming the electron injection layer may be any one of various materials including LiF, NaCl, CsF, Li2O, and BaO. Although the deposition conditions of the electron control layer 375 vary according to the material that is used to form the electron injection layer, in general, the deposition conditions may be similar to those used to form the hole injection layer 383.

A thickness of the electron injection layer 375 may be from about 1 Å to about 100 Å, and in some embodiments, may be from about 3 Å to about 90 Å. When the thickness of the electron injection layer 375 is within the range described above, the electron injection layer 375 may have satisfactory electron injection characteristics without a substantial increase in a driving voltage.

The second electrode 390 is disposed on the organic layer 350. The second electrode 390 may be a cathode, which is an electron injection electrode. A material for forming the second electrode may be a metal, an alloy, an electrically conductive compound, all of which have low-work functions, or a mixture thereof. For example, lithium (Li), magnesium (Mg), aluminum (Al), aluminum:lithium (Al: Li), calcium (Ca), magnesium:indium (Mg:In), magnesium: silver (Mg:Ag), or the like may be formed as a thin film, which is then used as a transmissive electrode. In some embodiments, to manufacture a top-emission light-emitting device, a transmissive electrode may be formed of indium tin oxide (ITO) or indium zinc oxide (IZO).

In the organic light-emitting device 300 having such a structure, the flow of electrons injected from the electron transportation layer 373 to the emission layer 360 is controlled due to the electron control layer 371, and thus, in a high brightness region, luminescent efficiency is high, and in a low brightness region, luminescent efficiency is low.

Figure 4:
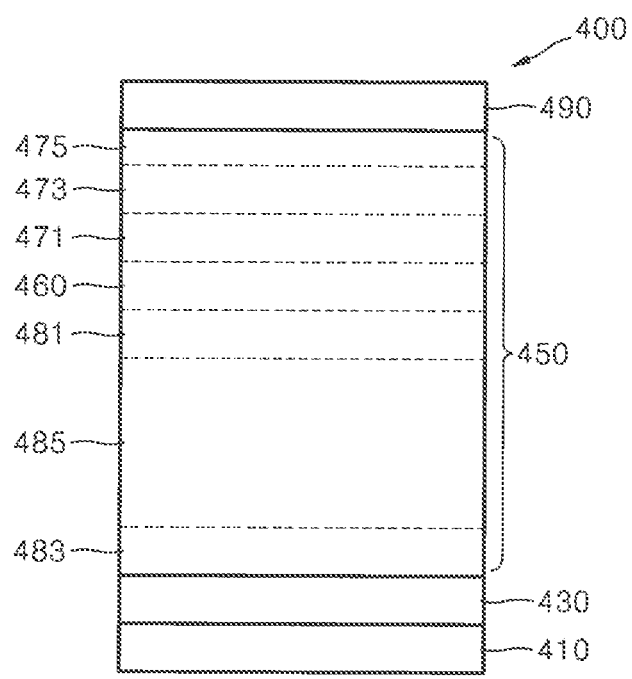
FIG. 4 is a schematic cross-sectional view of an organic light-emitting device having a substrate/first electrode/hole injection layer/hole transportation layer/electron blocking layer/emission layer/electron control layer/electron transportation layer/electron injection layer/second electrode structure, according to another embodiment of the present invention.

FIG. 4 is a schematic cross-sectional view of an organic light-emitting device 400 according to an embodiment of the present invention, and the organic light-emitting device 400 has a substrate 410/first electrode 430/hole injection layer 483/hole transportation layer 481/electron blocking layer 481/emission layer 460/electron control layer 471/electron transportation layer 473/electron injection layer 475/second electrode 490 structure.

The substrate 410, the first electrode 430, the hole injection layer 483, the hole transportation layer 485, the emission layer 460, the electron control layer 471, the electron transportation layer 473, the electron injection layer 475, and the second electrode 490 are the same as described above in connection with FIG. 3.

The electron blocking layer 481 may be disposed between the emission layer 460 and at least one of the hole injection layer 483, the hole transportation layer 485, or the functional layer having hole injection capability and hole transportation capability (not shown). The electron blocking layer 481 may prevent electrons that fail to recombine with holes in the emission layer 460 from moving toward the first electrode 430. The electron blocking layer 481 may be formed of an electron blocking material. Examples of the electron blocking material include at least one of a triphenylamine derivative, a carbazole derivative, and/or a spirodifluorene derivative.

A thickness of the electron blocking layer 481 may be from about 10 Å to about 1000 Å, and in some embodiments, may be from about 50 Å to about 800 Å. When the thickness of the electron blocking layer 481 is within the range described above, the electron blocking layer 481 may have satisfactory electron blocking characteristics without a substantial increase in a driving voltage.

In the organic light-emitting device 400 having such a structure, the flow of electrons that are injected from the electron transportation layer 473 to the emission layer 460 and then to the hole transportation layer 485 is controlled due to the electron control layer 471 and the electron blocking layer 481. Thus, in a high brightness region, luminescent efficiency is high, and in a low brightness region, luminescent efficiency is low.

Figure 5:
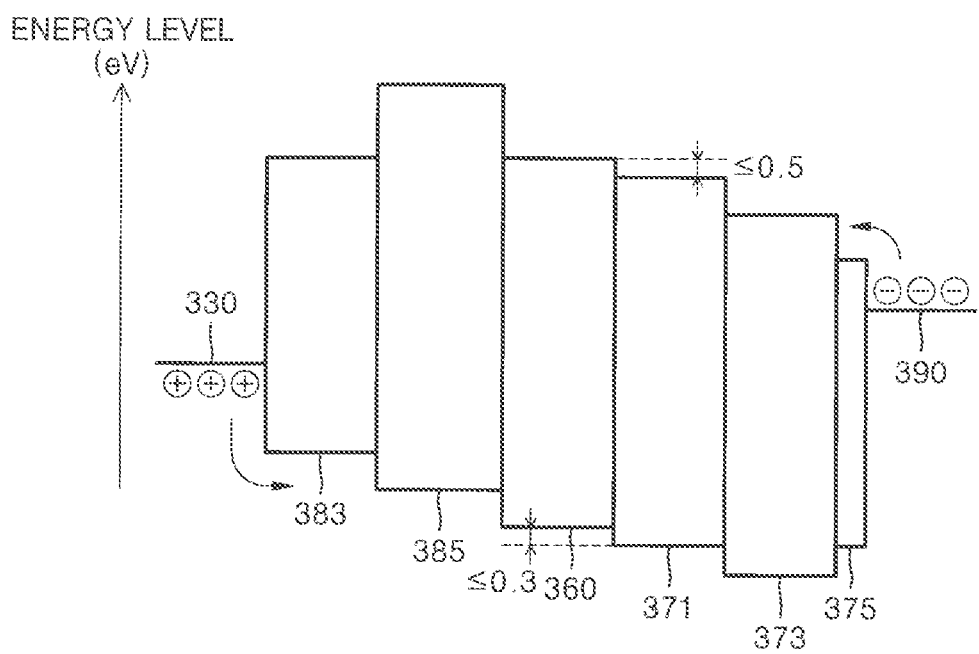
FIG. 5 is a schematic view of the highest occupied molecular orbital (HOMO) and lowest unoccupied molecular orbital (LUMO) energy levels of the layers of the organic light-emitting device of FIG. 3.

FIG. 5 schematically shows the highest occupied molecular orbital energy levels and lowest unoccupied molecular orbital energy levels of the layers of the organic light-emitting device 300 of FIG. 3. The highest occupied molecular orbital energy level of the electron control layer 371 including an electron control material is lower than the highest occupied molecular orbital energy level of the emission layer 360 including a host material, with the difference being about 0.3 eV or lower. In addition, the lowest unoccupied molecular orbital energy level of the electron control layer 371 is lower than the highest occupied molecular orbital energy level of the emission layer 360, with the difference being about 0.5 eV or lower. Due to such relationships, in a high brightness region, the electron control layer 371 may suppress holes that flow through the electron control layer 371 from the emission layer 360, thereby increasing brightness of the organic light-emitting device 300; and in a low brightness region, the electron control layer 371 may promote the flow of holes toward the electron transportation layer 371 from the emission layer 360 through the electron control layer 371, thereby decreasing brightness of the organic light-emitting device 300.

Figure 6:
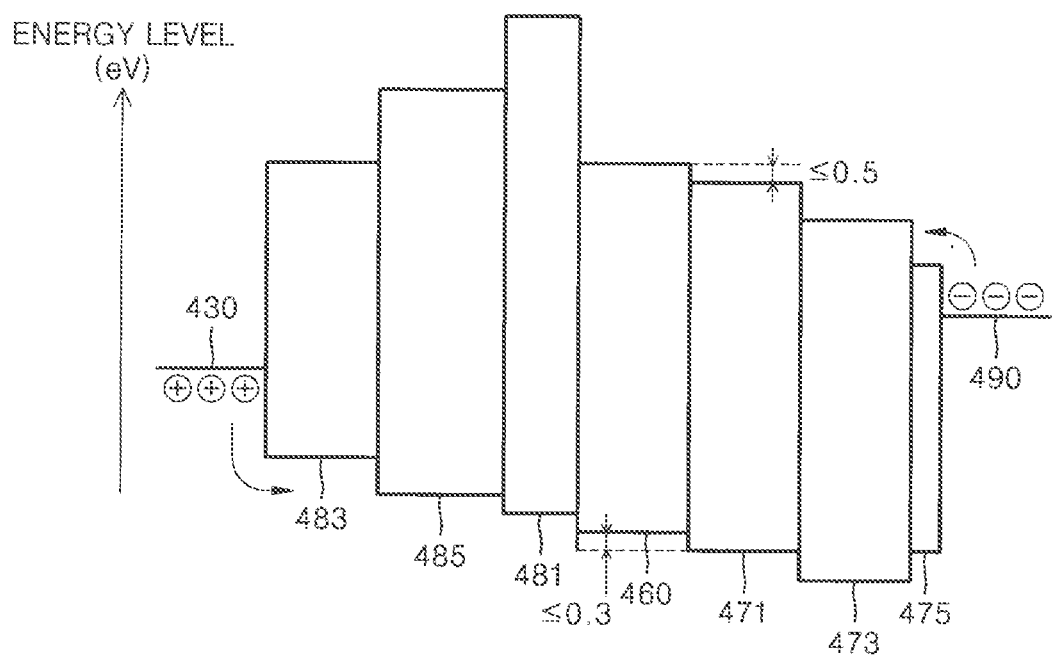
FIG. 6 is a schematic view of the HOMO and LUMO energy levels of the layers of the organic light-emitting device of FIG. 4.

FIG. 6 schematically shows the highest occupied molecular orbital energy levels and the lowest unoccupied molecular orbital energy levels of the layers of the organic light-emitting device 400 of FIG. 4. The highest occupied molecular orbital energy level of the electron control layer 471 including an electron control material is lower than the highest occupied molecular orbital energy level of the emission layer 460 including a host material, with the difference being about 0.3 eV or lower. In addition, the lowest unoccupied molecular orbital energy level of the electron control layer 471 is lower than the highest occupied molecular orbital energy level of the emission layer 460, with the difference being about 0.5 eV or lower.

The electron blocking layer 481 including an electron blocking material may be disposed between the emission layer 460 and the first electrode 430, and in this regard, the electron blocking layer 481 is in the vicinity of the emission layer 460. The lowest unoccupied molecular orbital energy level of the electron blocking layer 481 may be higher than the lowest unoccupied molecular orbital energy level of the emission layer 460. Due to such relationships, in a high brightness region, the electron control layer 471 may suppress the flow of holes through the electron control layer 471 from the emission layer 460, and the electron blocking layer 481 may suppress the flow of electrons that fail to combine with holes in the emission layer 460 toward the first electrode 430, thereby increasing brightness of the organic light-emitting device 400. Also, in a low brightness region, the electron control layer 471 may promote the flow of electrons from the emission layer 460 to the electron transportation layer 471 through the electron control layer 471, thereby decreasing brightness of the organic light-emitting device 400.

An organic light-emitting display apparatus according to an embodiment of the present invention includes the organic light-emitting device according to an embodiment of the present invention as well as a transistor including a source, a drain, a gate, and an active layer. A first electrode of the organic light-emitting device is electrically connected to one of the source or the drain of the transistor.

The active layer of the transistor may be formed of, for example, an amorphous silicon layer, a crystalline silicon layer, an organic semiconductor layer, or an oxide semiconductor layer.

The organic light-emitting display apparatus may suppress red and green emission in a black state, and thus, luminescent efficiency characteristics with respect to brightness may be improved.

The unsubstituted $C_1$-$C_{30}$ alkyl group (or $C_1$-$C_{30}$ alkyl group) used herein may be a $C_1$-$C_{30}$ linear or branched alkyl group, such as methyl, ethyl, propyl, isobutyl, sec-butyl, pentyl, iso-amyl, or hexyl. The substituted $C_1$-$C_{30}$ alkyl group refers to the substitution of at least hydrogen atom of the unsubstituted $C_1$-$C_{30}$ alkyl group with a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_6$-$C_{30}$ aryl group, a $C_2$-$C_{30}$ heteroaryl group, —N($Q_{101}$)($Q_{102}$), or Si($Q_{103}$)($Q_{104}$)($Q_{105}$)($Q_{106}$)- (where $Q_{101}$ to $Q_{106}$ are each independently hydrogen, a $C_1$-$C_{30}$ alkyl group, a $C_2$-$C_{30}$ alkenyl group, a $C_2$-$C_{30}$ alkynyl group, a $C_6$-$C_{30}$ aryl group, or a $C_2$-$C_{30}$ heteroaryl group).

The unsubstituted $C_1$-$C_{30}$ alkoxy group (or $C_1$-$C_{30}$ alkoxy group) used herein has a formula of —OA (where A is the unsubstituted $C_1$-$C_{30}$ alkyl group described above), and examples thereof include methoxy, ethoxy, and isopropyloxy. The substituted $C_1$-$C_{30}$ alkoxy group refers to the substitution of at least one hydrogen atom of the $C_1$-$C_{30}$ alkoxy group with the substituents described above in connection with the substituted $C_1$-$C_{30}$ alkyl group.

The unsubstituted $C_2$-$C_{30}$ alkenyl group (or $C_2$-$C_{30}$ alkenyl group) used herein refers to an unsubstituted $C_2$-$C_{30}$ alkyl group having one or more carbon-carbon double bonds at a center or end thereof. Examples of the unsubstituted $C_2$-$C_{30}$ alkenyl group include ethenyl, propenyl, and butenyl. The substituted $C_2$-$C_{30}$ alkenyl group refers to the substitution of at least one hydrogen atom of the $C_2$-$C_{30}$ alkenyl group with the substituents described above in connection with the substituted $C_1$-$C_{30}$ alkyl group.

The unsubstituted $C_2$-$C_{30}$ alkynyl group (or $C_2$-$C_{30}$ alkynyl group) used herein refers to an unsubstituted $C_2$-$C_{30}$ alkyl group having one or more carbon-carbon triple bonds at a center or end thereof. Examples of the unsubstituted $C_2$-$C_{30}$ alkynyl group include ethynyl, propynyl, and the like. The substituted $C_2$-$C_{30}$ alkynyl group refers to the substitution of at least one hydrogen atom of the $C_2$-$C_{30}$ alkynyl group with the substituents described above in connection with the substituted $C_1$-$C_{30}$ alkyl group.

The unsubstituted $C_6$-$C_{30}$ aryl group is a monovalent group having a carbocyclic aromatic system having 5 to 60 carbon atoms including at least one aromatic ring. The unsubstituted $C_6$-$C_{30}$ arylene group is a divalent group having a carbocyclic aromatic system having 5 to 60 carbon atoms including at least one aromatic ring. When the aryl group or arylene group include two or more rings, the rings may be fused to each other. The substituted $C_6$-$C_{30}$ aryl group refers to the substitution of at least one hydrogen atom of the $C_6$-$C_{30}$ aryl group with the substituents described above in connection with the substituted $C_1$-$C_{30}$ alkyl group. The substituted $C_6$-$C_{30}$ arylene group refers to the substitution of at least one hydrogen atom of the $C_6$-$C_{30}$ arylene group with the substituents described above in connection with the substituted $C_1$-$C_{30}$ alkyl group.

The unsubstituted $C_2$-$C_{30}$ heteroaryl group used herein refers to a monovalent group having a system including one or more aromatic rings having at least one hetero atom selected from nitrogen (N), oxygen (O), phosphorous (P), and sulfur (S) in the ring (with the remaining ring atoms being carbon atoms). The unsubstituted $C_2$-$C_{30}$ heteroarylene group used herein refers to a divalent group having a system including one or more aromatic rings having at least one hetero atom selected from nitrogen (N), oxygen (O), phosphorous (P), and sulfur (S) in the ring (with the remaining ring atoms being carbon atoms). In this regard, when the heteroaryl group or heteroarylene group includes two or more rings, the rings may be fused to each other. The substituted $C_2$-$C_{30}$ heteroaryl group refers to the substitution of at least one hydrogen atom of the $C_2$-$C_{30}$ heteroaryl group with the substituents described above in connection with the $C_1$-$C_{30}$ alkyl group. The substituted $C_2$-$C_{30}$ heteroarylene group refers to the substitution of at least one hydrogen atom of the $C_2$-$C_{30}$ heteroarylene group with the substituents described above in connection with the $C_1$-$C_{30}$ alkyl group.

The unsubstituted $C_6$-$C_{30}$ aryloxy group used herein is represented by —$OA_2$ (where $A_2$ is the substituted or unsubstituted $C_6$-$C_{30}$ aryl group). The substituted $C_6$-$C_{30}$ aryloxy group refers to the substitution of at least one hydrogen atom of the $C_6$-$C_{30}$ aryloxy group with the substituents described above in connection with the $C_1$-$C_{30}$ alkyl group.

The unsubstituted $C_6$-$C_{30}$ arylthio group used herein is represented by —$SA_3$ (where $A_3$ is the substituted or unsubstituted $C_3$-$C_{30}$ aryl group). The substituted $C_6$-$C_{30}$ arylthio group refers to the substitution of at least one hydrogen atom on the $C_6$-$C_{30}$ arylthio group with the substituents described in connection with the $C_1$-$C_{30}$ alkyl group.

Hereinafter, an organic light-emitting diode according to an embodiment of the present invention will be described with reference to the following examples. However, the organic light-emitting diode according to an embodiment of the present invention is not limited thereto. Indeed, the examples are presented for illustrative purposes only and are not intended to limit the scope of the present invention.

Example 1

An anode was prepared by cutting an ITO (7 nm)/Ag (100 nm)/ITO (7 nm) substrate (manufactured by Samsung mobile display (SMD) Co., Ltd using glass manufactured by Corning Company) to a size of 50 mm×50 mm×0.7 mm, ultrasonically cleaning the glass substrate using isopropyl alcohol and pure water for 30 minutes each, and then irradiating with UV light for 10 minutes and exposing to ozone to clean. Then, the anode was loaded into a vacuum deposition apparatus.

Compound 301 was vacuum deposited on the glass substrate to form a hole injection layer having a thickness of 750 Å, and then Compound 311 was vacuum deposited on the hole injection layer to form a hole transportation layer having a thickness of 1300 Å.

Compound 507 as a host and Compound 401 as a phosphorescent dopant were co-deposited at a weight ratio of 98:2 on the hole transportation layer to form a red emission layer having a thickness of 400 Å.

Subsequently, Compound 1 and Compound 401 were vacuum deposited on the emission layer at a ratio of 98:2 to form an electron control layer having a thickness of 50 Å.

Compound 201 (identical to Compound 1) and LiQ were vacuum deposited on the electron control layer at a weight ratio of 1:1 to form an electron transportation layer having a thickness of 100 Å.

LiQ was vacuum deposited on the electron transportation layer to form an electron injection layer having a thickness of 5 Å, and then, Mg and Ag were vacuum deposited at a weight ratio of 10:1 to form a cathode having a thickness of 130 Å, thereby completing the manufacturing of an organic light-emitting device.

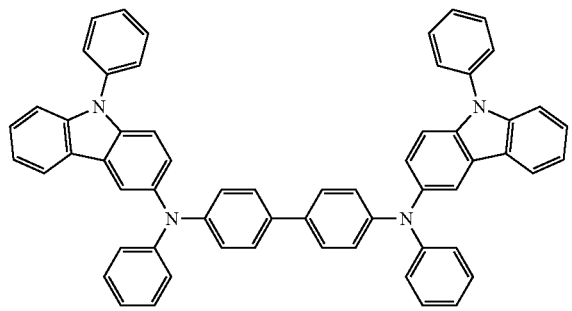

301

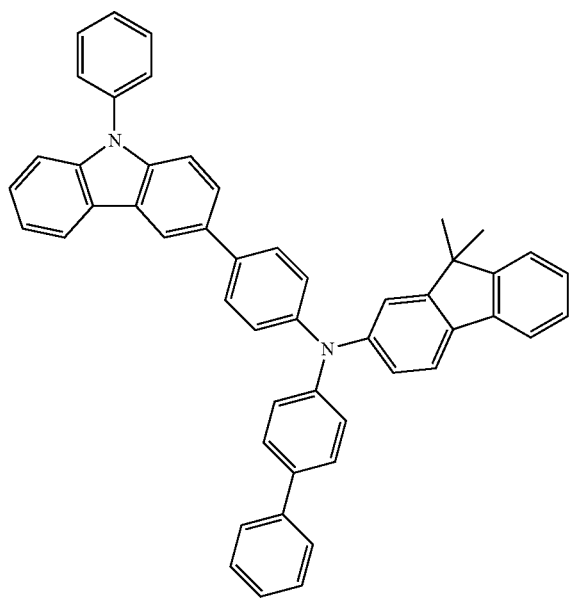

311

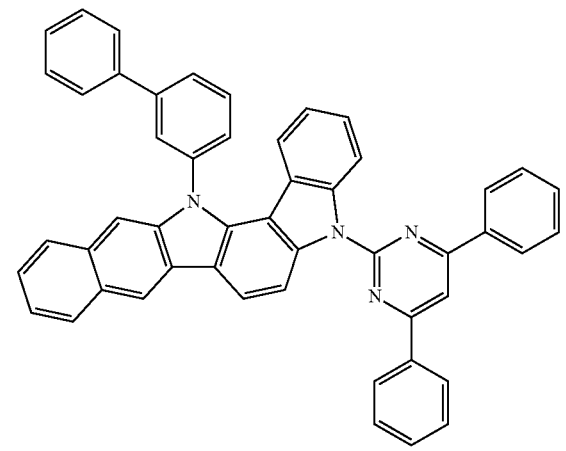

507

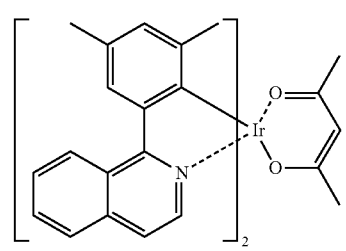

401

-continued

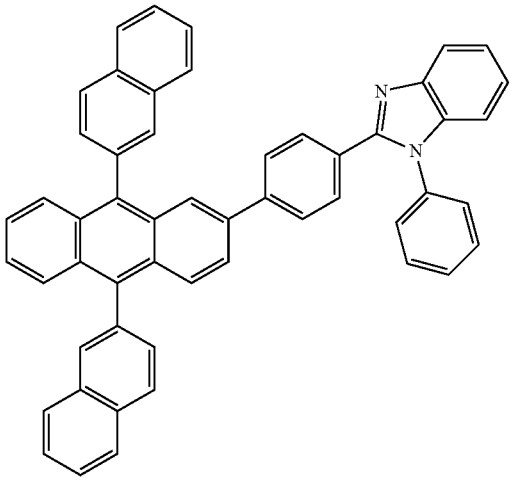

Example 2

An organic light-emitting device was manufactured as in Example 1, except that the electron control layer was formed to a thickness of 100 Å instead of 50 Å.

Example 3

An organic light-emitting device was manufactured as in Example 1, except that the electron control layer was formed to a thickness of 100 Å instead of 50 Å, and a second electron control layer having a thickness of 100 Å and formed of only Compound 1 was additionally formed on the first electron control layer.

Comparative Example 1

An organic light-emitting device was manufactured as in Example 1, except that the electron control layer was not formed.

Comparative Example 2

An organic light-emitting device was manufactured as in Example 1, except that the electron control layer was formed of only Compound 1.

Evaluation Example

Figure 7:
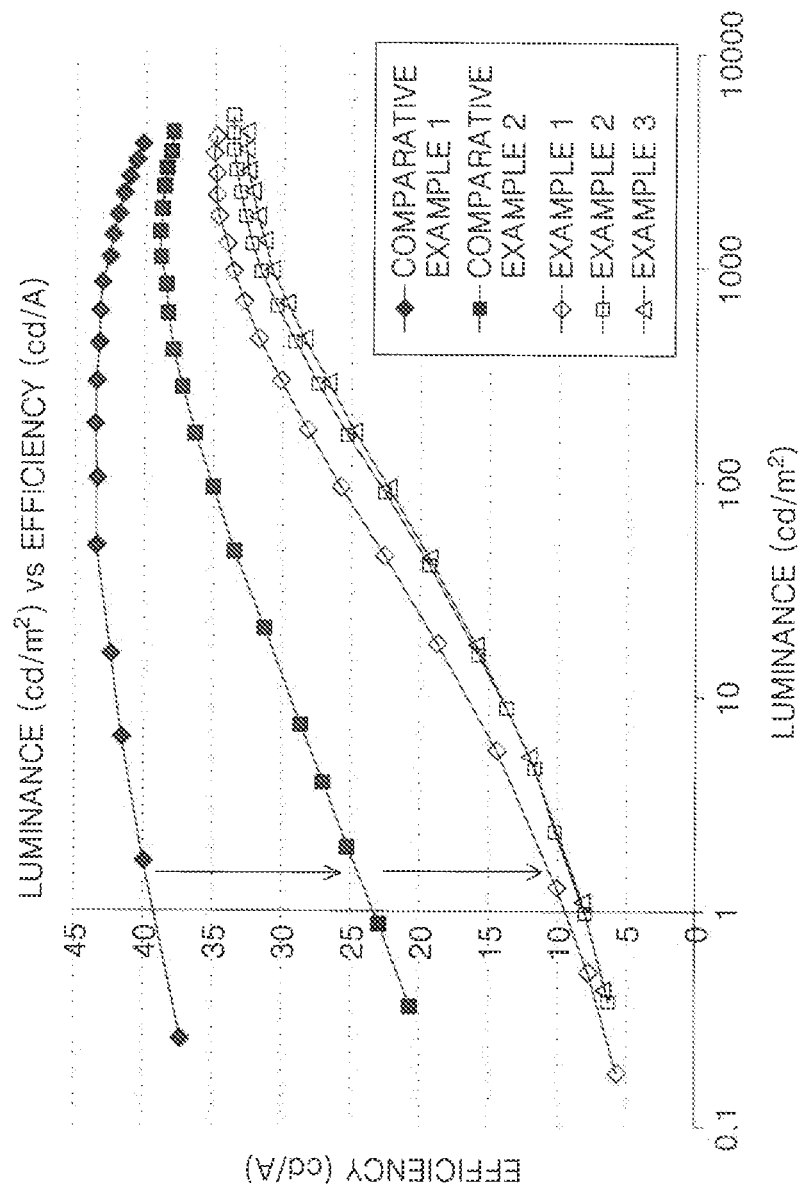
FIG. 7 is a graph comparing the efficiency with respect to brightness of the organic light-emitting devices manufactured according to Examples 1 to 3 and Comparative Examples 1 and 2.

Red luminescent efficiency of each of the organic light-emitting devices manufactured according to Examples 1 to 3 and Comparative Examples 1 and 2 was measured at a brightness of 0.1 cd/m² to 10,000 cd/m², and the results are shown in FIG. 7. The graph of FIG. 7 was normalized, and the normalized results are shown in FIG. 8.

Referring to FIG. 7, in a low brightness region, the organic light-emitting devices of Examples 1 to 3 had lower luminescent efficiency than the organic light-emitting devices of Comparative Examples 1 and 2.

Figure 8:
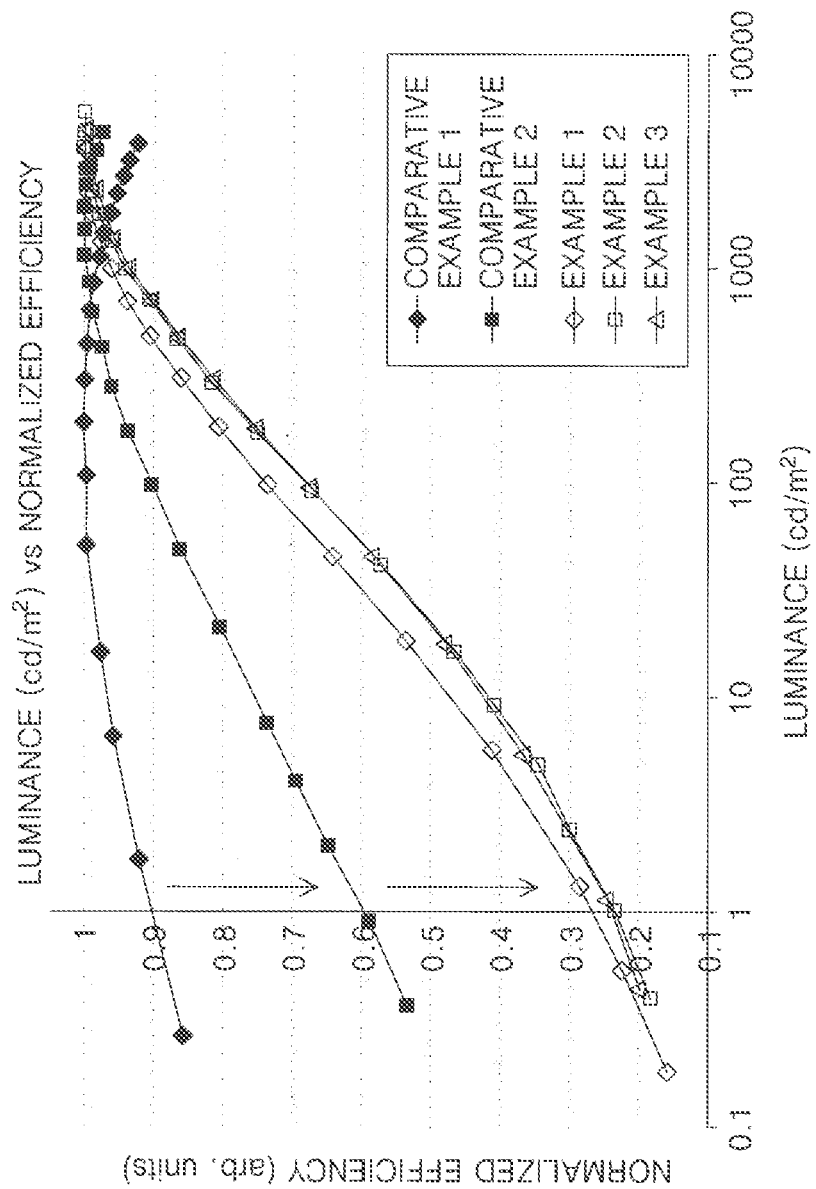
FIG. 8 is a graph comparing the normalized efficiency with respect to brightness of the organic light-emitting devices manufactured according to Examples 1 to 3 and Comparative Examples 1 and 2.

Referring to FIG. 8, which is the normalized graph of FIG. 7, in a high brightness region of about 100 cd/m² or more, the organic light-emitting devices of Examples 1 to 3 and the organic light-emitting devices of Comparative Examples 1 and 2 had similar luminescent efficiency to each other. However, in a low brightness region of about 1 cd/m², the organic light-emitting devices of Examples 1 to 3 had much lower luminescent efficiency than the organic light-emitting devices of Comparative Examples 1 and 2. The decrease in luminescent efficiency was indicated as an arrow in the graph for ease of identification.

Improvement in the luminescent efficiency characteristics with respect to brightness of the organic light-emitting devices of Examples 1 to 3 and Comparative Examples 1 and 2 was identified by calculating the S-ratio (S-ratio), and the results are shown in Table 1.

TABLE 1

| | Example 1 | Example 2 | Example 3 | Comparative Example 1 | Comparative Example 2 |
|---|---|---|---|---|---|
| LE@1 cd/m2 | 9.08 | 7.86 | 7.89 | 38.64 | 23.04 |
| LE@1000 cd/m2 | 33.60 | 31.51 | 30.69 | 42.76 | 38.60 |
| S-ratio | 3.70 | 4.01 | 3.89 | 1.11 | 1.68 |

LE: Luminance Efficiency
S-ratio = (LE at 1000 cd/m2)/(LE at 1 cd/m2)

The S-ratio is defined as the current efficiency value at 1,000 cd/m² divided by the current efficiency value at 1 cd/d. The higher the S-ratio, the graph of brightness vs. efficiency is more like the letter 'S'. The results show that the organic light-emitting devices according to embodiments of the present invention have high luminescent efficiency in a high brightness region and low luminescent efficiency in a low brightness region.

Referring to Table 1, the S-ratio of the organic light-emitting device of Examples 1 to 3 is close to 4 or higher than 4, and the S-ratio of the organic light-emitting devices of Comparative Examples 1 and 2 is a value of 1 to 2. That is, the brightness vs. efficiency graphs of the organic light-emitting devices of Examples 1 to 3 are more like the letter 'S' than those of the organic light-emitting devices of Comparative Examples 1 and 2.

From these results, it was identified that since the organic light-emitting devices of Examples 1 to 3 have high red luminescent efficiency in a high brightness region and low red luminescent efficiency in a low brightness region, luminescent efficiency characteristics with respect to brightness are improved.

In addition, in comparing Examples 2 and 3, the luminescent efficiency of Example 3 (in which the thickness of the electron control layer was increased due to the inclusion of the first electron control layer and the second electron control layer) was not distinguished from that of Example 2 (in which the electron control layer was relatively thin due to the inclusion of only one electron control layer). Rather, Example 2 (in which the electron control layer was relatively thin) had a slightly higher S value than Example 3. From these results, it was confirmed that an organic light-emitting device according to an embodiment of the present invention need not have an increasingly thick electron control layer, and that a relatively thin electron control layer can yield a high S value.

An organic light-emitting device according to an embodiment of the present invention includes an electron control layer, and due to the ability to control the flow of electrons injected into the emission layer, has improved luminescent efficiency characteristics with respect to brightness in which luminescent efficiency in a high brightness region is high and luminescent efficiency in a low brightness region is low.

An organic light-emitting device according to another embodiment of the present invention includes an electron control layer and an electron blocking layer, and due to the ability to control the flow of electrons injected into the emission layer, has improved luminescent efficiency characteristics with respect to brightness in which luminescent efficiency in a high brightness region is high and luminescent efficiency in a low brightness region is low.

An organic light-emitting display apparatus according to an embodiment of the present invention includes the organic light-emitting device and has improved luminescent efficiency characteristics with respect to brightness due to the suppression of red and green emission in a black state.

While the present invention has been illustrated and described with reference to certain exemplary embodiments, those of ordinary skill in the art understand that certain changes can be made to the described embodiments without departing from the spirit and scope of the present invention as defined by the following claims.

What is claimed is:

1. An organic light-emitting device comprising:
a first electrode,
a second electrode facing the first electrode,
a phosphorescent emission layer between the first electrode and the second electrode,
an electron transportation layer between the phosphorescent emission layer and the second electrode, and
an electron control layer between the phosphorescent emission layer and the electron transportation layer;
wherein:
the phosphorescent emission layer comprises a host material and a dopant material, the electron control layer comprises an electron control material and a phosphorescent dopant, and the host material comprises a bipolar compound comprising a hole transportation unit and an electron transportation unit, the electron transportation unit being selected from a unit including a pyrimidine derivative, and a unit including a triazine derivative, and the dopant material in the phosphorescent emission layer is a same material as the phosphorescent dopant in the electron control layer;
a highest occupied molecular orbital (HOMO) energy level ($EH_H$) of the host material, a lowest unoccupied molecular orbital (LUMO) energy level ($EL_H$) of the host material, a highest occupied molecular orbital energy level ($EH_C$) of the electron control material, and a lowest unoccupied molecular orbital energy level ($EL_C$) of the electron control material satisfy $|EH_H-EH_C| \leq 0.3$ eV and $|EL_H-EL_C| \leq 0.5$ eV; and
a thickness of the electron control layer is in a range of about 10 Å to about 450 Å,
wherein the electron transportation layer comprises a metal complex represented by Formula 5:

$M^+L^-$ <Formula 5> wherein:
M is an alkali metal; and
L is an aromatic compound selected from the group consisting of anthracene, naphthalene, diphenylanthracene, terphenyl, quaterphenyl, quinquephenyl, sexiphenyl, quinolinol, benzoquinolinol, acridinol, hydroxyphenyloxazole, hydroxyphenylthiazole, hydroxydiaryloxadiazole, hydroxydiarylthiadiazole, hydroxyphenylpyridine, hydroxyphenylbenzimidazole, hydroxybenzotriazole, hydroxyfluorene, bipyridyl, phenanthroline, phthalocyanine, porphyrin, and derivatives thereof,
wherein the electron transportation layer is a single layer directly on the electron control layer, and
a thickness ratio of the electron transportation layer to the electron control layer is 5:1 to 5:10.

2. The organic light-emitting device of claim 1, further comprising:
an electron blocking layer between the phosphorescent emission layer and the first electrode.

3. The organic light-emitting device of claim 2, wherein a thickness of the electron blocking layer is in a range of about 10 Å to about 1000 Å.

4. The organic light-emitting device of claim 2, wherein the electron blocking layer comprises at least one of a triphenylamine derivative, a carbazole derivative, or a spirodifluorene derivative.

5. The organic light-emitting device of claim 1, wherein a highest occupied molecular orbital energy level ($EH_H$) of the host material, a lowest unoccupied molecular orbital energy level ($EL_H$) of the host material, a highest occupied molecular orbital energy level ($EH_C$) of the electron control material, and a lowest unoccupied molecular orbital energy level ($EL_C$) of the electron control material satisfy $0 \leq EH_H-EH_C \leq 0.3$ eV and $0 \leq EL_H-EL_C \leq 0.5$ eV.

6. The organic light-emitting device of claim 1, wherein electron mobility of the electron control material is equal to or higher than hole mobility of the electron control material.

7. The organic light-emitting device of claim 1, wherein the highest occupied molecular orbital energy level ($EH_C$) of the electron control material is in a range of about $-5.2$ eV to about $-6.1$ eV.

8. The organic light-emitting device of claim 1, wherein the lowest unoccupied molecular orbital energy level ($EL_C$) of the electron control material is in a range of about $-2.5$ eV to about $-3.2$ eV.

9. The organic light-emitting device of claim 1, wherein a thickness of the electron control layer is in a range of about 30 Å to about 150 Å.

10. The organic light-emitting device of claim 1, wherein the phosphorescent emission layer is a blue phosphorescent emission layer, a red phosphorescent emission layer, or a green phosphorescent emission layer.

11. The organic light-emitting device of claim 1, wherein the electron control material comprises a compound represented by Formula 1:

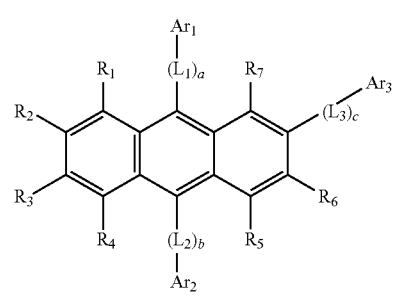

<Formula 1> wherein:
$R_1$ to $R_7$ are each independently hydrogen, deuterium, halogen, a hydroxyl group, a cyano group, a nitro group, an amino group, carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, or a substituted or unsubstituted $C_6$-$C_{30}$ aryl group;

$Ar_1$, $Ar_2$, and $Ar_3$ are each independently a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, or a group represented by —$N(Q_1)(Q_2)$, $Q_1$ and $Q_2$ are each independently hydrogen, deuterium, halogen, a hydroxyl group, a cyano group, an amino group, a nitro group, carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, or a substituted or unsubstituted $C_2$-$C_{30}$ heteroaryl group, $L_1$, $L_2$ and $L_3$ are each independently a substituted or unsubstituted $C_6$-$C_{30}$ arylene group or a substituted or unsubstituted $C_2$-$C_{30}$ heteroarylene group, and a, b and c are each independently an integer of 0 to 3.

12. The organic light-emitting device of claim 1, wherein the electron control material comprises at least one compound represented by one of Formulae 2 or 3:

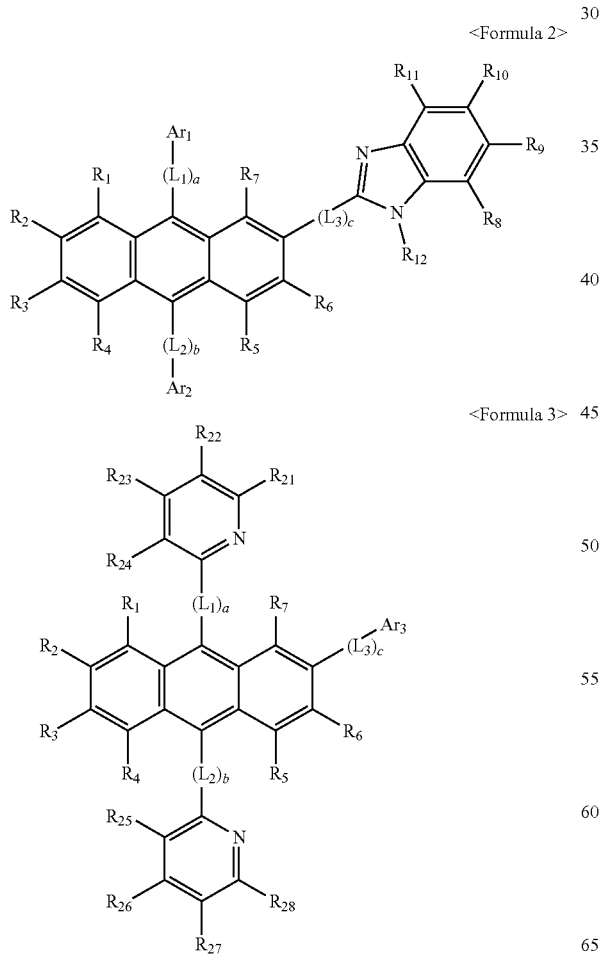

<Formula 2>

<Formula 3> wherein:

$R_1$ to $R_{12}$ and $R_{21}$ to $R_{28}$ are each independently hydrogen, deuterium, a substituted or unsubstituted methyl group, a substituted or unsubstituted ethyl group, a substituted or unsubstituted propyl group, a substituted or unsubstituted butyl group, a substituted or unsubstituted phenyl group, a substituted or unsubstituted biphenyl group, a substituted or unsubstituted naphthyl group, a substituted or unsubstituted anthryl group, a substituted or unsubstituted phenanthrenyl group, or a substituted or unsubstituted pyrenyl group, $Ar_1$, $Ar_2$, and $Ar_3$ are each independently a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spirofluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentacenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted bipyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzopuranyl group, a substituted or unsubstituted dibenzothiophenyl group, or a substituted or unsubstituted benzocarbazolyl group, $L_1$, $L_2$ and $L_3$ are each independently a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentacenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, a substituted or unsubstituted isoxazolylene group, a substituted or unsubstituted dibenzothiophenylene group, a substituted or unsubstituted dibenzopuranylene group, a substituted or unsubstituted triazinylene group, or a substituted or unsubstituted oxadiazolylene group, and a, b, and c are each independently an integer of 0 to 1.

13. The organic light-emitting device of claim 1, wherein the electron control material comprises at least one of Compounds 1 or 2 below:

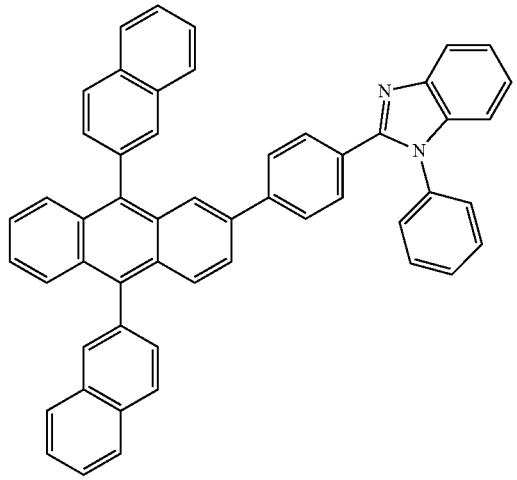

1

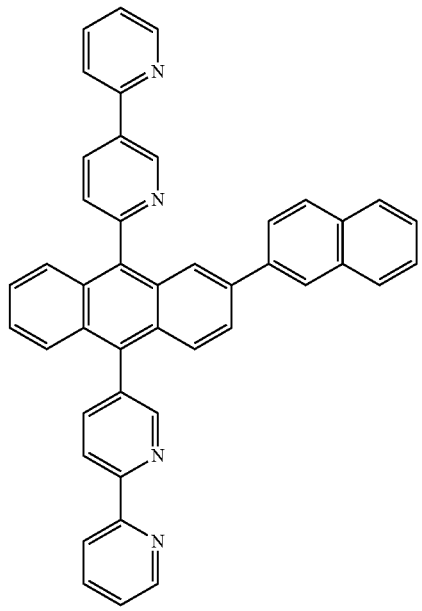

2

14. The organic light-emitting device of claim 1, wherein the phosphorescent dopant of the electron control material is an Ir complex, a Pt complex, a Pd complex, or an Os complex.

15. The organic light-emitting device of claim 1, wherein the dopant material in the phosphorescent emission layer and the phosphorescent dopant of the electron control layer is any one of the following compounds:

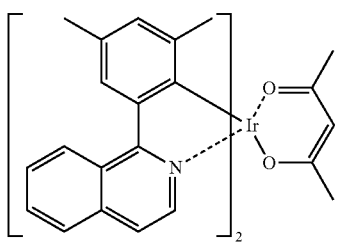
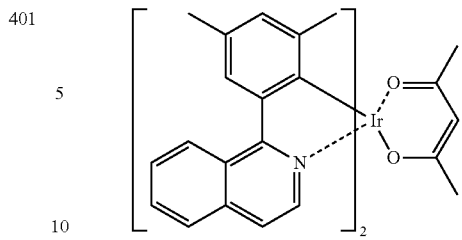
401
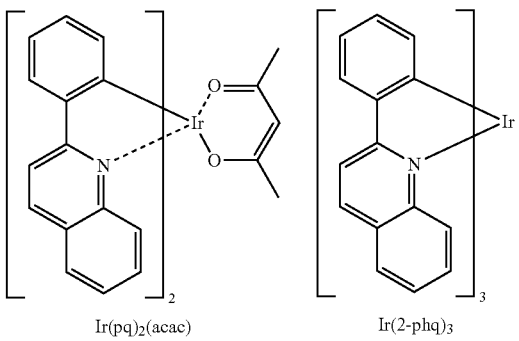
402
Ir(pq)₂(acac)    Ir(2-phq)₃
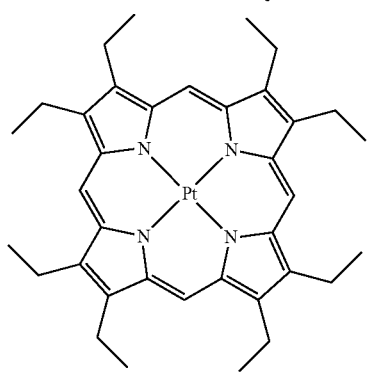
PtOEP
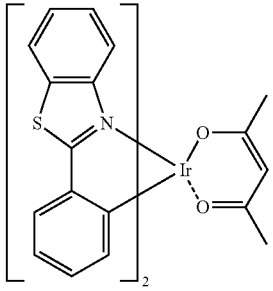
Ir(BT)₂(acac)
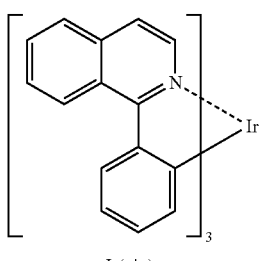
Ir(piq)₃
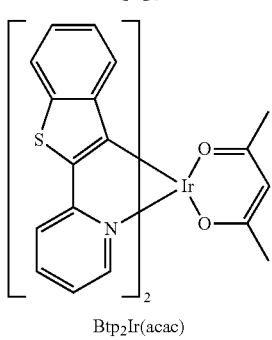
Btp₂Ir(acac)
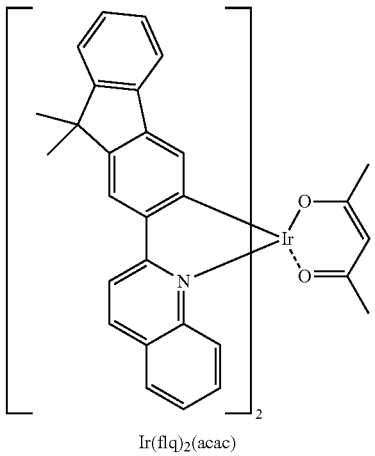
Ir(flq)₂(acac)

-continued
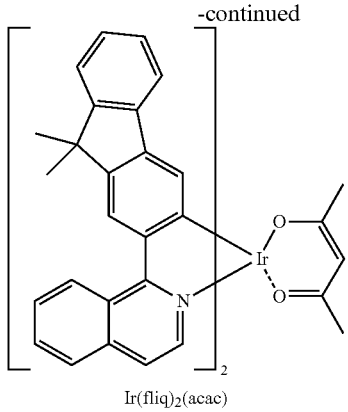
Ir(fliq)₂(acac)
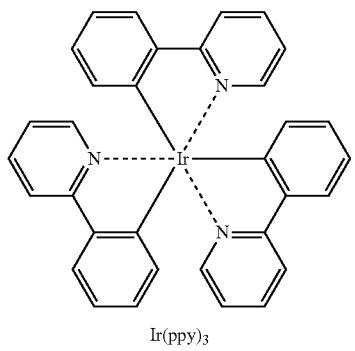
Ir(ppy)₃
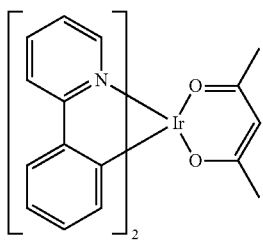
Ir(ppy)₂(acac)
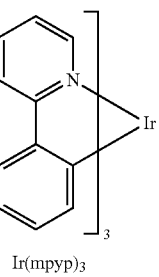
Ir(mpyp)₃
D1
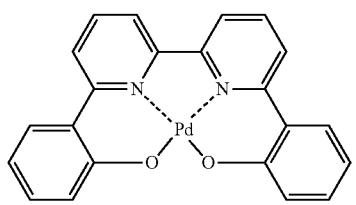
D2
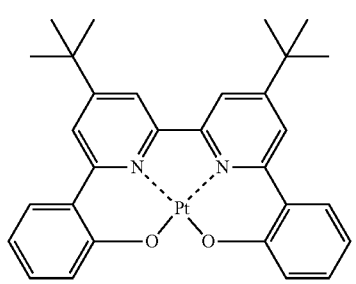
-continued
D3
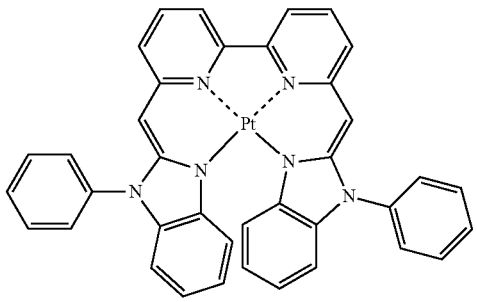
D4
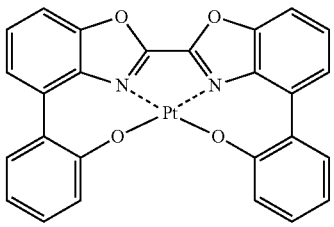
D5
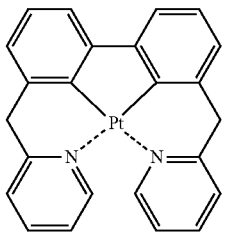
D6
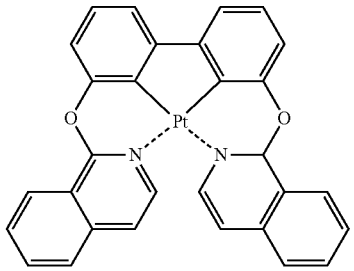
D7
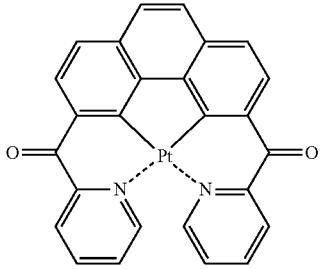
D8
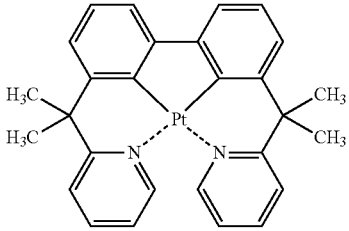

D9 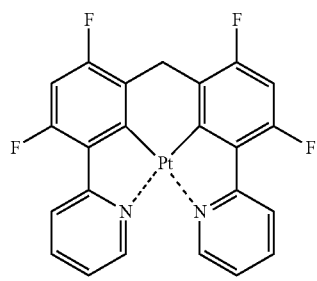
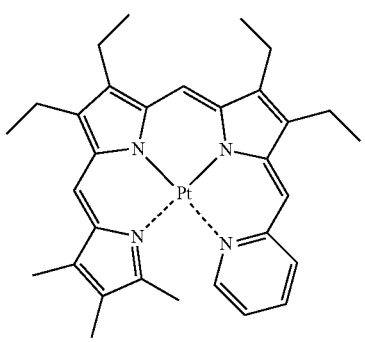 D14
D10 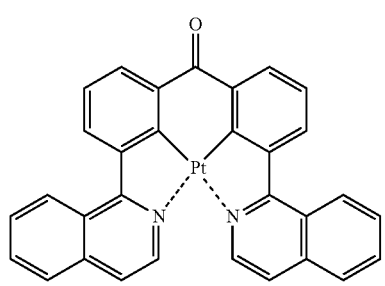
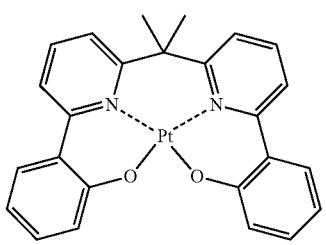 D15
D11 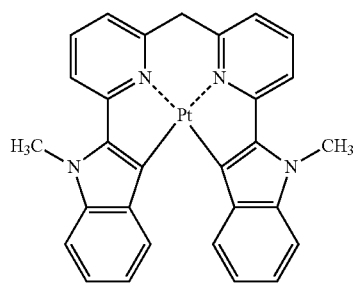
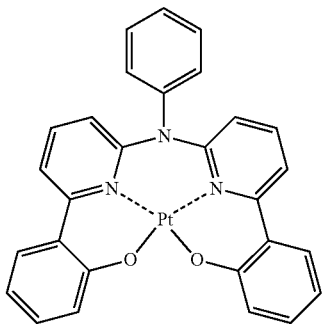 D16
D12 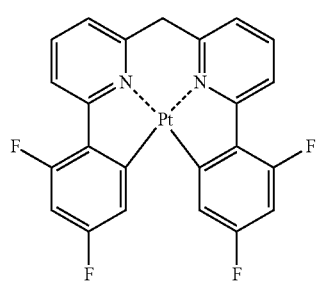
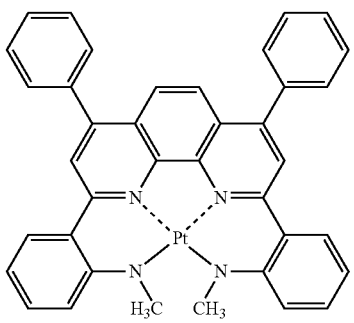 D17
D13 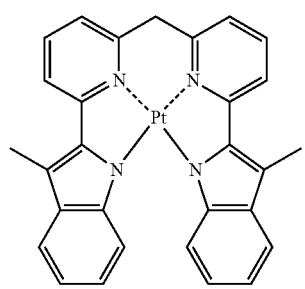
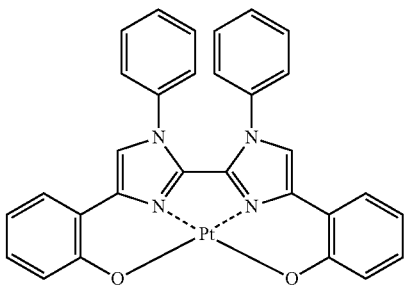 D18

-continued
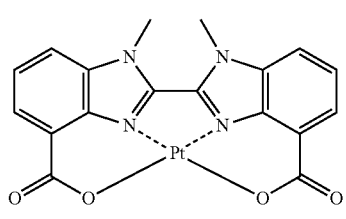
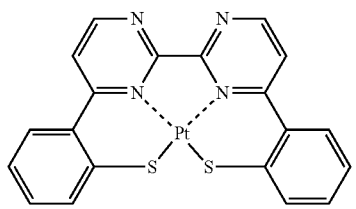
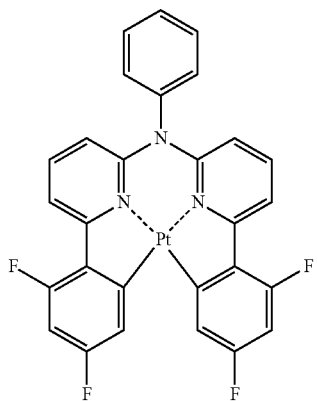
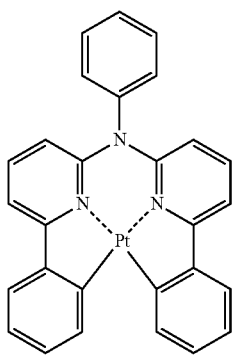
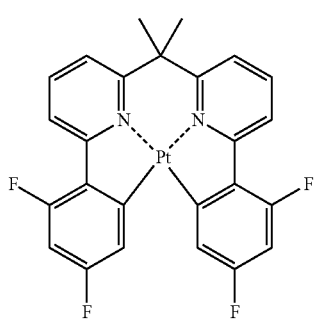
-continued
D19
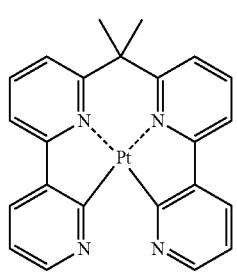
D20
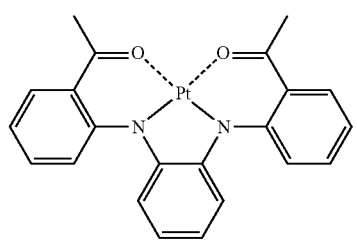
D21
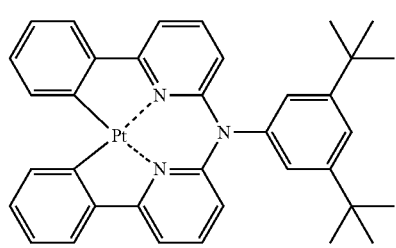
D22
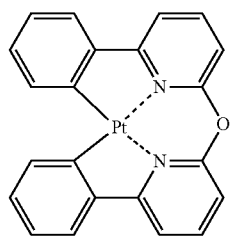
D23
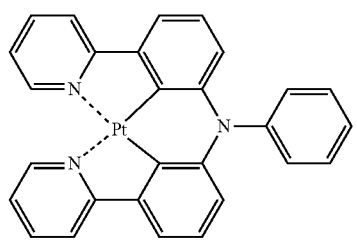
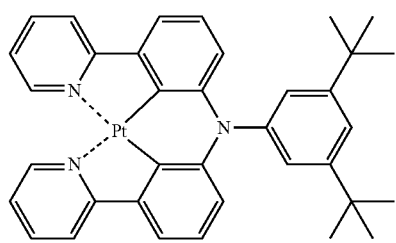
D24
D25
D26
D27
D28
D29

-continued
D30
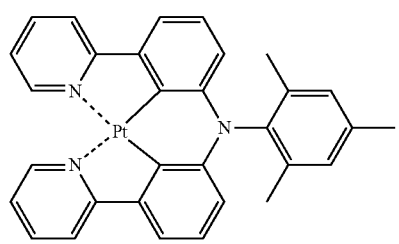
D31
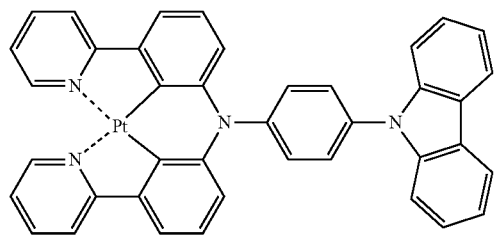
D32
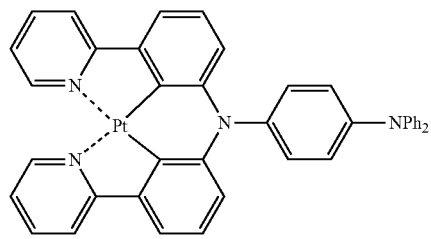
D33
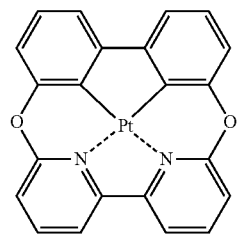
D34
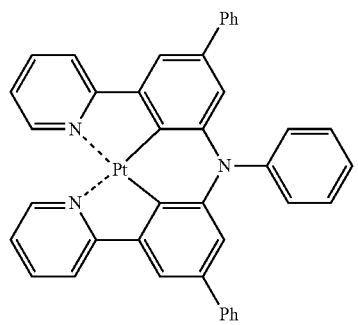
D35
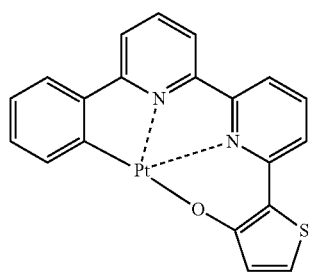
-continued
D36
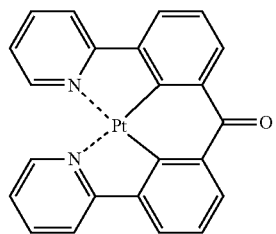
D37
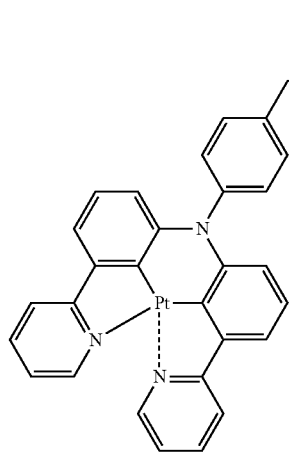
D38
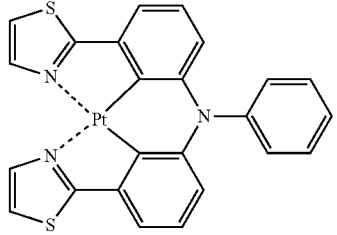
D39
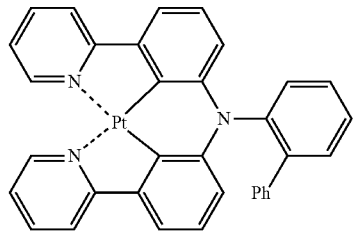
D40
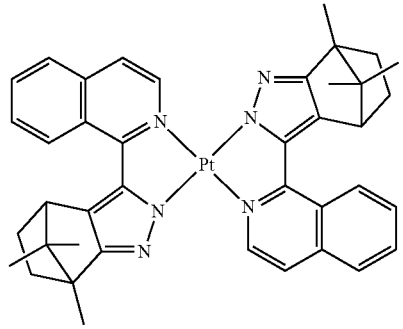

-continued
D41
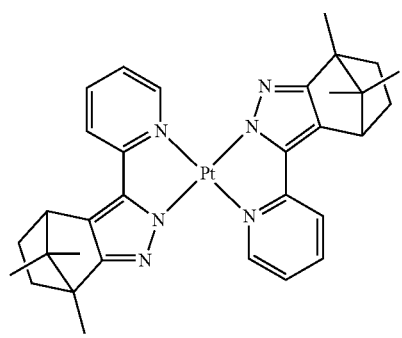
D42
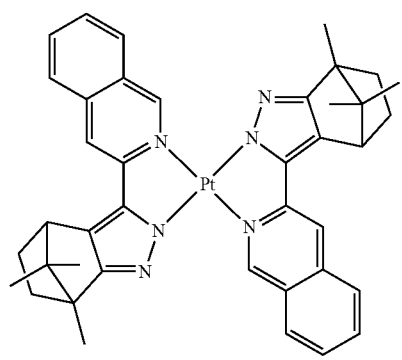
D43
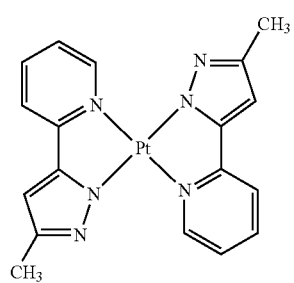
D44
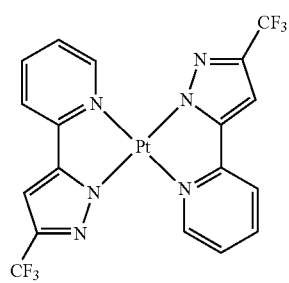
D45
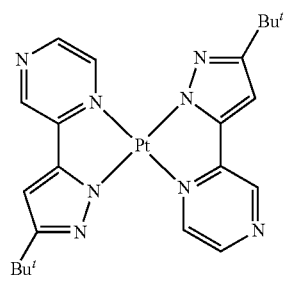
-continued
D46
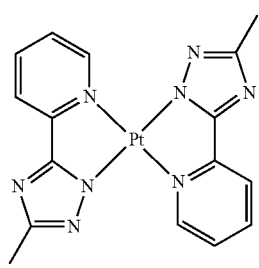
D47
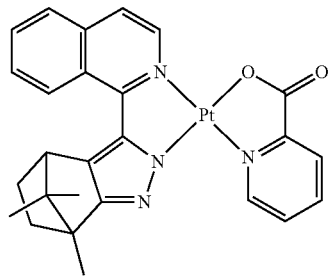
D48
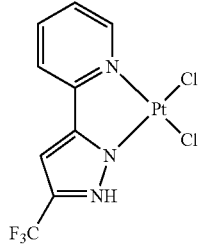
D49
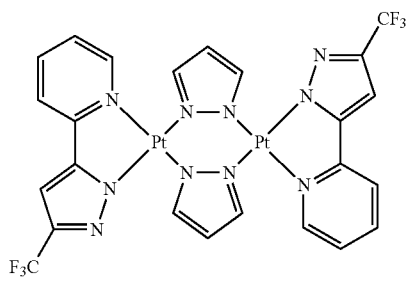
D50
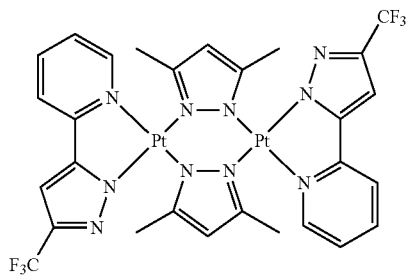

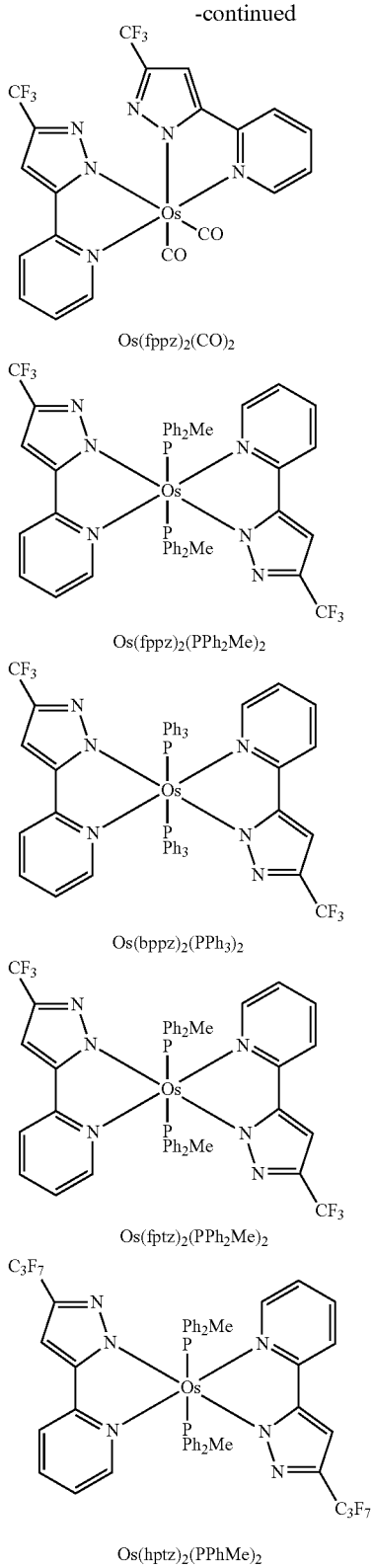

Os(fppz)₂(CO)₂

Os(fppz)₂(PPh₂Me)₂

Os(bppz)₂(PPh₃)₂

Os(fptz)₂(PPh₂Me)₂

Os(hptz)₂(PPhMe)₂

16. The organic light-emitting device of claim 1, wherein the host material comprises a mixture of the bipolar compound having the hole transportation unit and the electron transportation unit, and a compound having at least the hole transportation unit.

17. The organic light-emitting device of claim 1, wherein the electron control material comprises a compound represented by Formula 4:

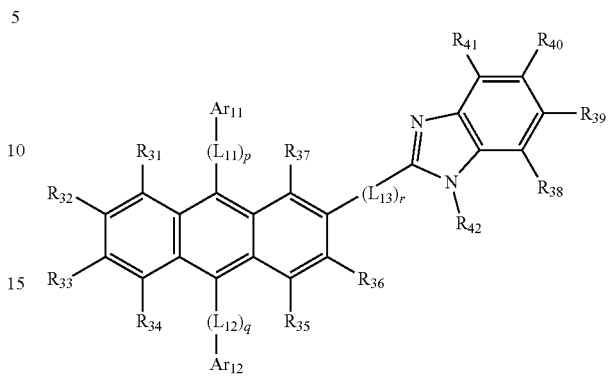

wherein:
$R_{31}$ to $R_{42}$ are each independently hydrogen, deuterium, a substituted or unsubstituted methyl group, a substituted or unsubstituted ethyl group, a substituted or unsubstituted propyl group, a substituted or unsubstituted butyl group, a substituted or unsubstituted phenyl group, a substituted or unsubstituted biphenyl group, a substituted or unsubstituted naphthyl group, a substituted or unsubstituted anthryl group, a substituted or unsubstituted phenanthrenyl group, or a substituted or unsubstituted pyrenyl group, $Ar_{11}$ and $Ar_{12}$ are each independently a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentacenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted bipyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted benzoquinolinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isooxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzofuranyl group, a substituted or unsubstituted dibenzothiophenyl group, or a substituted or unsubstituted benzocarbazolyl group, $L_{11}$, $L_{12}$, and $L_{13}$ are each independently a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenalenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentacenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, a substituted or unsubstituted isoxazolylene group, a substituted or unsubstituted dibenzothiophenylene group, a substituted or unsubstituted dibenzofuranylene group, a substituted or unsubstituted triazinylene group, or a substituted or unsubstituted oxadiazolylene group, and p, q, and r are each independently an integer of 0 to 1.

18. An organic light-emitting display apparatus comprising:
a transistor comprising a source, a drain, a gate, and an active layer; and
the organic light-emitting device of claim 1, wherein the first electrode of the organic light-emitting device is electrically connected to the source or the drain of the transistor.

19. An organic light-emitting display device, comprising:
a first electrode,
a second electrode facing the first electrode,
a phosphorescent emission layer between the first electrode and the second electrode,
an electron transportation layer between the phosphorescent emission layer and the second electrode, and
an electron control layer between the phosphorescent emission layer and the electron transportation layer;
wherein:
the phosphorescent emission layer comprises a host material and a dopant material, the electron control layer comprises an electron control material and a phosphorescent dopant, and the dopant material in the phosphorescent emission layer is a same material as the phosphorescent dopant in the electron control layer;
a highest occupied molecular orbital (HOMO) energy level ($EH_H$) of the host material, a lowest unoccupied molecular orbital (LUMO) energy level ($EL_H$) of the host material, a highest occupied molecular orbital energy level ($EH_C$) of the electron control material, and a lowest unoccupied molecular orbital energy level ($EL_C$) of the electron control material satisfy $|EH_H - EH_C| \leq 0.3$ eV and $|EL_H - EL_C| \leq 0.5$ eV; and
a thickness of the electron control layer is in a range of about 10 Å to about 450 Å,
wherein the electron transportation layer comprises a metal complex represented by Formula 5:

$$M^+L^- \qquad \qquad \text{<Formula 5>}$$

wherein:
M is an alkali metal; and
L is an aromatic compound selected from the group consisting of anthracene, naphthalene, diphenylanthracene, terphenyl, quaterphenyl, quinquephenyl, sexiphenyl, quinolinol, benzoquinolinol, acridinol, hydroxyphenyloxazole, hydroxyphenylthiazole, hydroxydiaryloxadiazole, hydroxydiarylthiadiazole, hydroxyphenylpyridine, hydroxyphenylbenzimidazole, hydroxybenzotriazole, hydroxyfluorene, bipyridyl, phenanthroline, phthalocyanine, porphyrin, and derivatives thereof, wherein the electron transportation layer is a single layer directly on the electron control layer, and a thickness ratio of the electron transportation layer to the electron control layer is 5:1 to 5:10.

20. An organic light-emitting device comprising:

a first electrode, a second electrode facing the first electrode, a phosphorescent emission layer between the first electrode and the second electrode, an electron transportation layer between the phosphorescent emission layer and the second electrode, and an electron control layer between the phosphorescent emission layer and the electron transportation layer;

wherein:

the phosphorescent emission layer comprises a host material and a dopant material, the electron control layer comprises an electron control material and a phosphorescent dopant, the dopant material in the phosphorescent emission layer is a same material as the phosphorescent dopant in the electron control layer, and the host material comprises a bipolar compound comprising a hole transportation unit and an electron transportation unit, the host material comprising a material represented by one of Compounds 501 through 509:

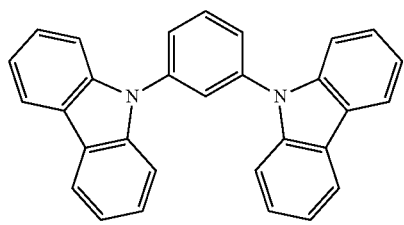

501

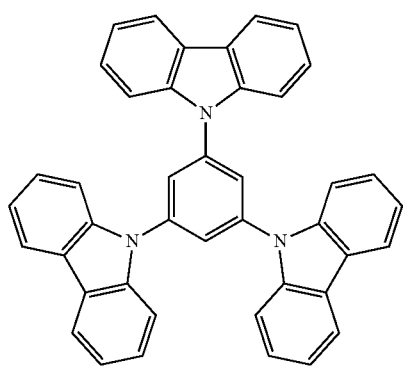

502

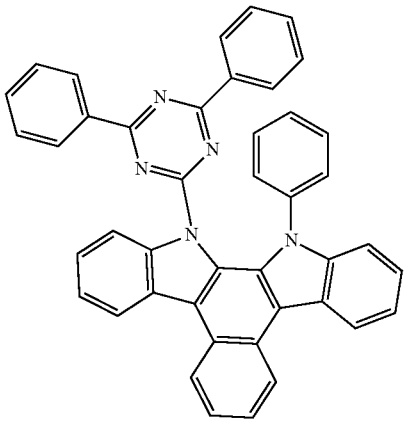

503

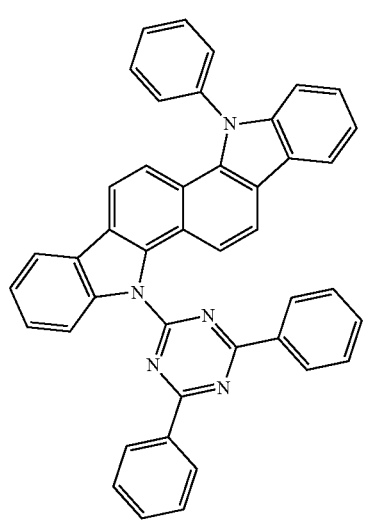

504

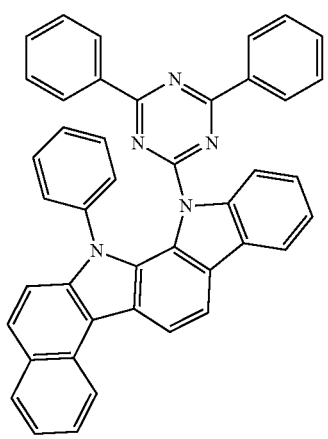

505

506

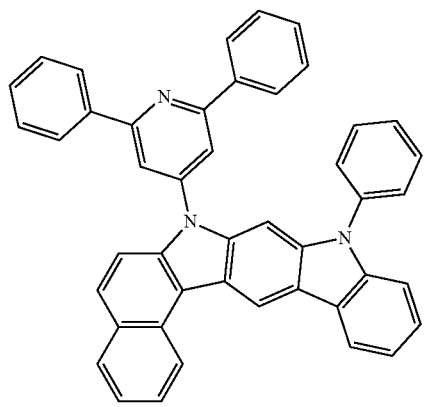

507

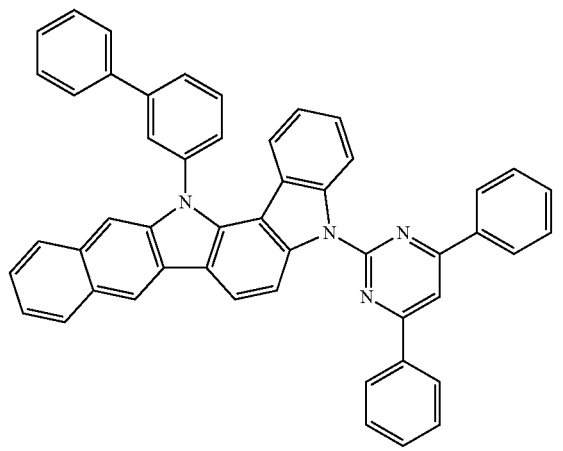

508

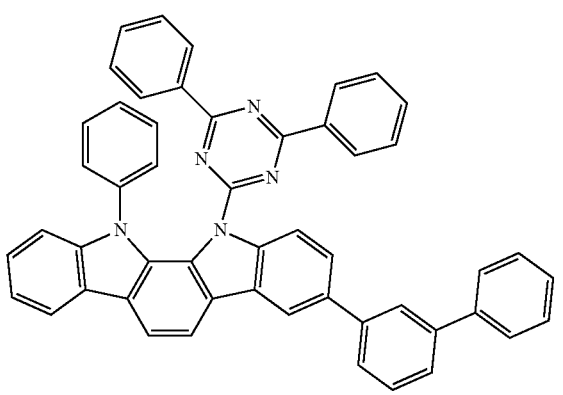

509

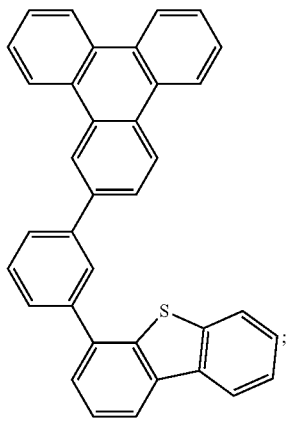

a highest occupied molecular orbital (HOMO) energy level ($EH_H$) of the host material, a lowest unoccupied molecular orbital (LUMO) energy level ($EL_H$) of the host material, a highest occupied molecular orbital energy level ($EH_C$) of the electron control material, and a lowest unoccupied molecular orbital energy level ($EL_C$) of the electron control material satisfy $|EH_H-EH_C|\leq 0.3$ eV and $|EL_H-EL_C|\leq 0.5$ eV; and a thickness of the electron control layer is in a range of about 10 Å to about 450 Å, wherein the electron transportation layer comprises a metal complex represented by Formula 5:

$$M^+L^- \qquad \text{<Formula 5>}$$

wherein:
M is an alkali metal; and
L is an aromatic compound selected from the group consisting of anthracene, naphthalene, diphenylanthracene, terphenyl, quaterphenyl, quinquephenyl, sexiphenyl, quinolinol, benzoquinolinol, acridinol, hydroxyphenyloxazole, hydroxyphenylthiazole, hydroxydiaryloxadiazole, hydroxydiarylthiadiazole, hydroxyphenylpyridine, hydroxyphenylbenzimidazole, hydroxybenzotriazole, hydroxyfluorene, bipyridyl, phenanthroline, phthalocyanine, porphyrin, and derivatives thereof, wherein the electron transportation layer is a single layer directly on the electron control layer, and a thickness ratio of the electron transportation layer to the electron control layer is 5:1 to 5:10.

* * * * *